United States Patent
Nakano et al.

(10) Patent No.: US 9,595,958 B1
(45) Date of Patent: Mar. 14, 2017

(54) SEMICONDUCTOR DEVICE AND DRIVING METHOD FOR THE SAME

(71) Applicant: Fuji Electric Co., Ltd., Kanagawa (JP)

(72) Inventors: Hayato Nakano, Nagano (JP); Ryohei Takayanagi, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/232,526

(22) Filed: Aug. 9, 2016

(30) Foreign Application Priority Data

Sep. 11, 2015 (JP) .................................. 2015-179992

(51) Int. Cl.
| | |
|---|---|
| *H03B 1/00* | (2006.01) |
| *H03K 3/00* | (2006.01) |
| *H03K 17/687* | (2006.01) |
| *H01L 29/16* | (2006.01) |
| *H01L 27/07* | (2006.01) |
| *H03K 17/74* | (2006.01) |
| *H01L 29/78* | (2006.01) |
| *H02P 27/06* | (2006.01) |

(52) U.S. Cl.
CPC ..... *H03K 17/6871* (2013.01); *H01L 27/0727* (2013.01); *H01L 29/1608* (2013.01); *H03K 17/74* (2013.01); *H01L 29/78* (2013.01); *H02P 27/06* (2013.01)

(58) Field of Classification Search
CPC  H03K 17/6871; H03K 17/74; H01L 27/0727; H01L 29/1608; H01L 29/78
USPC .... 327/108–112, 427, 434, 437; 326/82, 83, 326/87; 257/76, 77
See application file for complete search history.

(56) References Cited

U.S. PATENT DOCUMENTS

| | | | | |
|---|---|---|---|---|
| 7,053,677 | B2 * | 5/2006 | Yu ....................... | G06F 13/4072 326/81 |
| 2010/0309700 | A1 | 12/2010 | Maeda et al. | |
| 2014/0027787 | A1 * | 1/2014 | Gunjishima .......... | H01L 29/045 257/77 |
| 2014/0103356 | A1 * | 4/2014 | Krames ............... | H01L 33/0075 257/76 |

FOREIGN PATENT DOCUMENTS

JP     2009-183115 A      8/2009

\* cited by examiner

*Primary Examiner* — Lincoln Donovan
*Assistant Examiner* — Thomas Skibinski
(74) *Attorney, Agent, or Firm* — Chen Yoshimura LLP

(57) ABSTRACT

The semiconductor device includes a switching arm unit in which first and second wide bandgap semiconductor elements, each having a body diode, are connected in series between a positive line and a negative line; a current detecting unit that detects a current in at least a wide bandgap semiconductor element in which a flyback current flows; and a semiconductor element driving unit that drives the first and second wide bandgap semiconductor elements. When driving one of the wide bandgap semiconductor elements, the semiconductor element driving unit determines, by referring to a fault inhibiting characteristic curve, whether a flyback current detection value of the other wide bandgap semiconductor elements falls within a fault growth region or a fault inhibiting region, and when a result of the determination indicates that the flyback current detection value is within the fault growth region, inhibits a current flowing in the one wide bandgap semiconductor element.

8 Claims, 15 Drawing Sheets

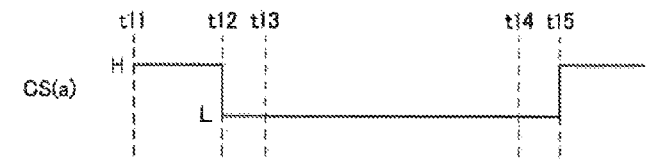
FIG. 10A  CS(a)
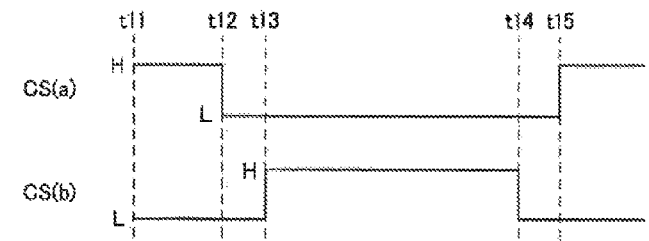
FIG. 10B  CS(b)
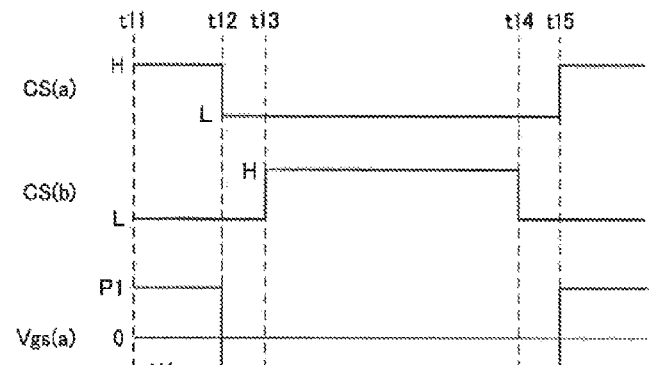
FIG. 10C  Vgs(a)
FIG. 10D  Vgs(b)
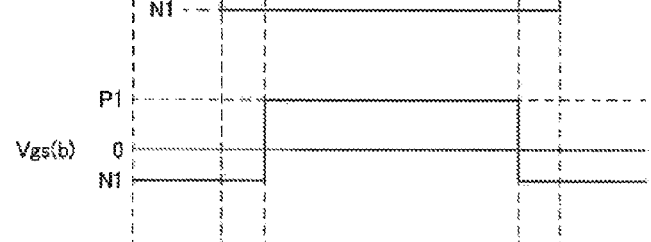
FIG. 10E  Iu
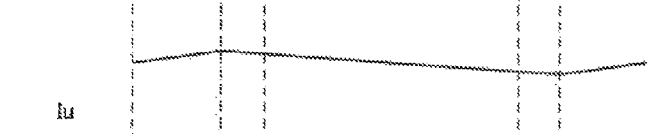
FIG. 10F  Id(a)
FIG. 10G  Id(b)
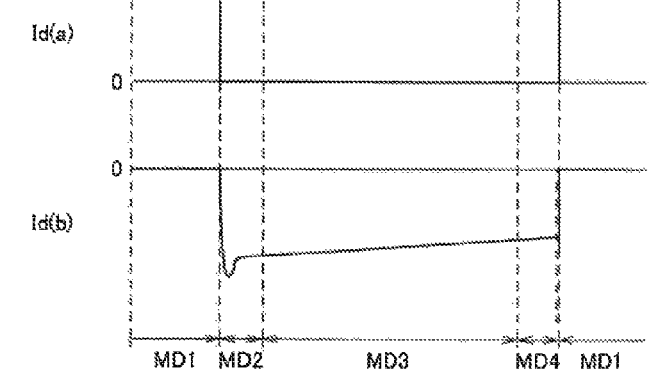

SEMICONDUCTOR DEVICE AND DRIVING METHOD FOR THE SAME

BACKGROUND OF THE INVENTION

Technical Field

The present invention relates to a semiconductor device in which a switching arm unit is constituted by connecting at least a first wide bandgap semiconductor element and a second wide bandgap semiconductor element in series, and to a method of driving the semiconductor device.

Background Art

This type of semiconductor device has been proposed in the form of a power conversion device that includes, for example, an inverter circuit configured to perform synchronous rectification using six switching elements, with a SiC-MOSFET, which is a unipolar element employing a wide bandgap semiconductor, being used for each switching element and the synchronous rectification being performed by using parasitic diodes of the SiC-MOSFETs as flyback diodes (see Patent Document 1, for example).

RELATED ART DOCUMENT

Patent Document

Patent Document 1: Japanese Patent Application Laid-Open Publication No. 2009-183115

SUMMARY OF THE INVENTION

However, the power conversion device according to the above-described Patent Document 1 has a problem in that stacking faults grow when a current flows in the body diode, which is the parasitic diode, of the SiC-MOSFET, thereby causing an on-state resistance in the SiC-MOSFET to rise and increasing conduction loss.

In light of the problem with the conventional example, it is an object of the present invention to provide a semiconductor device capable of reducing conduction loss by sufficiently inhibiting stacking faults from arising in a wide bandgap semiconductor element, and to provide a method of driving the semiconductor device. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a switching arm unit including a first wide bandgap semiconductor element and a second wide bandgap semiconductor element, each having a body diode, connected in series between a positive line and a negative line, the switching arm unit having a node between the first and second wide bandgap semiconductor elements that is configured to be connected to a load; a current detecting unit that detects a current in the second wide bandgap semiconductor element that indicates a flyback current flowing in the second wide bandgap semiconductor element, the flyback current being generated as a result of the load been driven by the first wide bandgap semiconductor element; a driving unit that drives the first wide bandgap semiconductor element and the second wide bandgap semiconductor element; and a memory storing a fault inhibiting characteristic curve defining a border between a fault growth region and a fault inhibiting region for a crystalline semiconductor constituting the second wide bandgap semiconductor element, wherein the driving unit determines, by referring to the fault inhibiting characteristic curve, whether the detected current of the second wide bandgap semiconductor element falls within the fault growth region or within the fault inhibiting region, and when a result of the determination indicates that the detected current is within the fault growth region, the driving unit outputs, to the first wide bandgap semiconductor element, a driving signal that reduces a current flowing in the first wide bandgap semiconductor element when driving the load therethrough so that a resultant current detected by the current detecting unit falls within the fault inhibiting region.

In another aspect, the present disclosure provides a method of driving a semiconductor device, the semiconductor device including a switching arm unit having a first wide bandgap semiconductor element and a second wide bandgap semiconductor element, each having a body diode, connected in series between a positive line and a negative line, the method including: a step of detecting a flyback current in the second wide bandgap semiconductor element; and a step of determining, by referring to a fault inhibiting characteristic curve expressing a border between a fault growth region and a fault inhibiting region, whether the detected flyback current in the second wide bandgap semiconductor element is within the fault growth region or within the fault inhibiting region.

In another aspect, the present disclosure provides a method of driving a semiconductor device, the semiconductor device including: a switching arm unit including: a first wide bandgap semiconductor element and a second wide bandgap semiconductor element, each having a body diode, connected in series, a first diode connected in reverse-parallel to the first wide bandgap semiconductor element, and a second diode connected in reverse-parallel to the second wide bandgap semiconductor element; and a memory storing: a characteristic line map, having a plurality of characteristic lines, each of which expresses, using a flyback current flowing in the body diode of the second wide bandgap semiconductor element as a parameter, a relationship between a ratio of an inductance of the second wide bandgap semiconductor element to an inductance of the diode connected in reverse-parallel to the second wide bandgap semiconductor element and a pulsewidth of a pulse-form current occurring in the flyback current in the body diode of the second wide bandgap semiconductor element at a beginning of the flyback current, the relationship inhibiting occurrence of stacking fault in a crystalline semiconductor constituting the second wide bandgap semiconductor element; and a slope characteristic line map that indicates, as a function of a maximum current of the flyback current, a permissible range of slopes from slopes of the characteristic lines in the characteristic line map within which occurrence of the stacking fault in the crystalline semiconductor constituting the second wide bandgap semiconductor element is inhibited, the method including: selecting a slope of a characteristic line from the permissible range of slopes indicated in the slope characteristic line map on the basis of the maximum current of the flyback current; determining a desired pulsewidth of the pulse-form current occurring in the flyback current in the body diode of the second wide bandgap semiconductor element in accordance with the selected slope of the characteristic line; and driving the first and second wide bandgap semiconductor elements in such a manner as to generate the desired pulsewidth for the pulse-form current occurring in the flyback current in the body diode of the second wide bandgap semiconductor element, thereby inhibiting occurrence of the stacking fault in the crystalline semiconductor constituting the second wide bandgap semiconductor element.

In another aspect, the present disclosure provides a method of driving a semiconductor device, the semiconductor device including a switching arm unit including: a first wide bandgap semiconductor element and a second wide bandgap semiconductor element, each having a body diode, connected in series, a first diode connected in reverse-parallel to the first wide bandgap semiconductor element, and a second diode connected in reverse-parallel to the second wide bandgap semiconductor element, the method including: a step of calculating a flyback current in a body diode of the second wide bandgap semiconductor element from a ratio of an inductance of the second wide bandgap semiconductor element to an inductance of the diode connected in reverse-parallel to the second wide bandgap semiconductor element and a detected current flowing in the second wide bandgap semiconductor element; a step of determining, by referring to a fault inhibiting characteristic curve defining a border between a fault growth region and a fault inhibiting region on a basis of the calculated flyback current, a desired pulsewidth of a pulse-form current occurring in the flyback current in the body diode of the second wide bandgap semiconductor element at a beginning of the flyback current that falls within the fault inhibiting region; driving the first and second wide bandgap semiconductor elements in such a manner as to generate the determined desired pulsewidth for the pulse-form current occurring in the flyback current in the body diode of the second wide bandgap semiconductor element, thereby inhibiting occurrence of stacking fault in a crystalline semiconductor constituting the second wide bandgap semiconductor element.

According to an aspect of the present invention, stacking faults arising in a wide bandgap semiconductor element can be sufficiently inhibited, and conduction loss can be reduced.

It is to be understood that both the foregoing general description and the following detailed description are exemplary and explanatory, and are intended to provide further explanation of the invention as claimed.

BRIEF DESCRIPTION OF THE DRAWINGS

FIGS. 10A to 10G are timing charts illustrating operating waveforms of the semiconductor device according to Embodiment 1 of the present invention.

DETAILED DESCRIPTION OF EMBODIMENTS

A semiconductor device and driving method thereof according to an embodiment of the present invention will be described with reference to the drawings. The present embodiment will describe a voltage-driven semiconductor element as an example of a semiconductor element and a power conversion device as an example of the semiconductor device. First, a power conversion device 10 including the semiconductor device according to the present embodiment will be described using FIG. 1.

Figure 1:
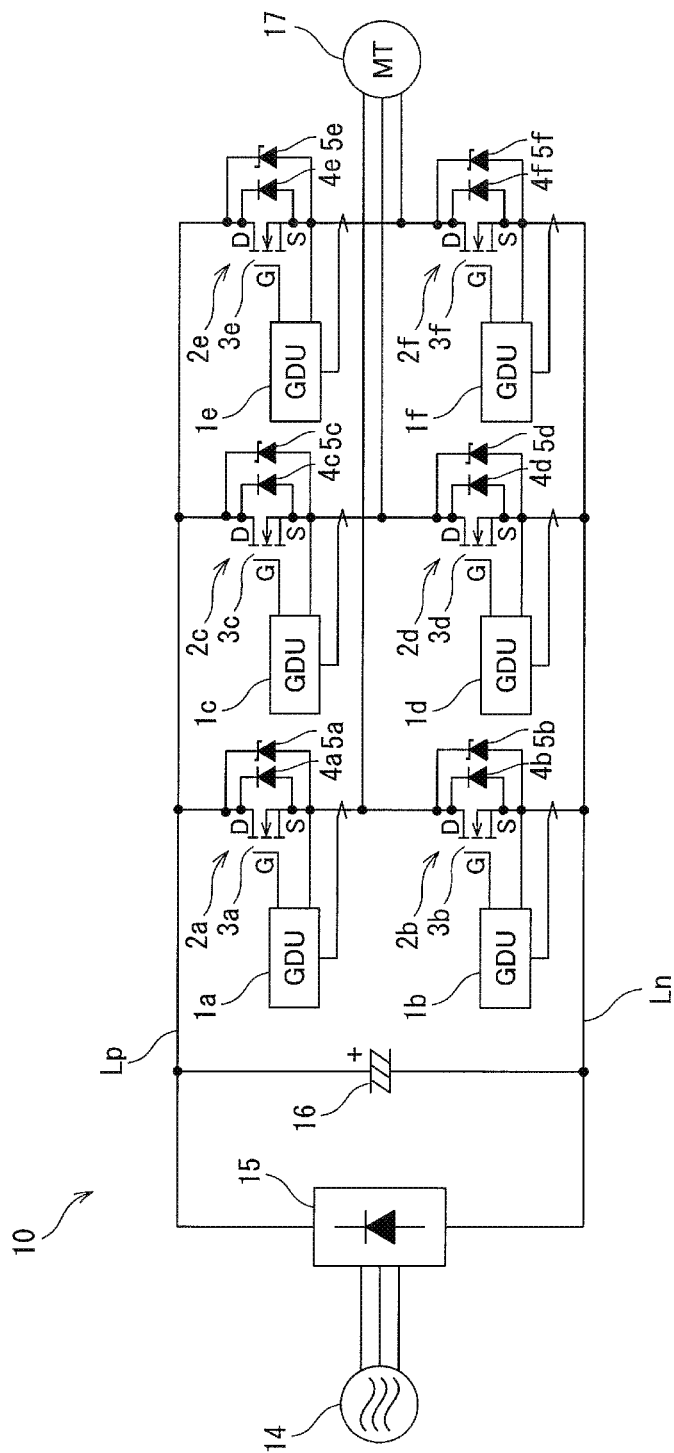
FIG. 1 is a circuit diagram illustrating the overall configuration of a power conversion device including a semiconductor device according to Embodiment 1 of the present invention.

As illustrated in FIG. 1, the power conversion device 10 is connected to a three-phase AC power source 14. The power conversion device 10 includes a rectifying circuit 15 that performs full-wave rectification of three-phase AC power inputted from the three-phase AC power source 14, and a smoothing capacitor 16 that smoothes the power rectified by the rectifying circuit 15. Although not illustrated, the rectifying circuit 15 is constituted by six diodes in a full-bridge connection or six switching elements in a full-bridge connection. A positive line Lp is connected to a positive output terminal of the rectifying circuit 15, and a negative line Ln is connected to a negative output terminal of the rectifying circuit 15. The smoothing capacitor 16 is connected between the positive line Lp and the negative line Ln.

The power conversion device 10 further includes semiconductor modules 2a, 2c, and 2e that constitute an upper arm unit connected to the positive-side line Lp and semiconductor modules 2b, 2d, and 2f that constitute a lower arm unit connected to the negative-side line Ln.

The semiconductor module 2a and the semiconductor module 2b constitute a switching arm unit connected in series between the positive line Lp and the negative line Ln. The semiconductor module 2c and the semiconductor module 2d constitute a switching arm unit connected in series between the positive line Lp and the negative line Ln. The semiconductor module 2e and the semiconductor module 2f constitute a switching arm unit connected in series between the positive line Lp and the negative line Ln.

A connection point between the semiconductor module 2a and the semiconductor module 2b, a connection point between the semiconductor module 2c and the semiconductor module 2d, and a connection point between the semiconductor module 2e and the semiconductor module 2f are connected to a three-phase electric motor 17 serving as an inductive load.

The semiconductor module 2a includes an N-type SiC-MOSFET (an example of a first wide bandgap semiconductor element) 3a, a body diode 4a parasitic to the MOSFET 3a, and a free-wheeling Schottky barrier diode 5a connected in reverse parallel to the MOSFET 3a, and constitutes an arm unit. The respective cathodes of the body diode 4a and the Schottky barrier diode 5a are connected to a drain terminal D of the MOSFET 3a, and the respective anodes of the body diode 4a and the Schottky barrier diode 5a are connected to a source terminal S of the MOSFET 3a.

Like the semiconductor module 2a, the semiconductor module 2b includes an N-type SiC-MOSFET 3b (an example of a second wide bandgap semiconductor element), a body diode 4b, and a Schottky barrier diode 5b, and constitutes an arm unit.

Like the semiconductor modules 2a and 2b, the semiconductor module 2c also includes an N-type SiC-MOSFET (an example of a first wide bandgap semiconductor element) 3c, a body diode 4c, and a Schottky barrier diode 5c, and constitutes an arm unit.

The semiconductor module 2d also includes an N-type SiC-MOSFET (an example of a second wide bandgap semiconductor element) 3d, a body diode 4d, and a Schottky barrier diode 5d, and constitutes an arm unit.

The semiconductor module 2e also includes an N-type SiC-MOSFET (an example of a first wide bandgap semiconductor element) 3e, a body diode 4e, and a Schottky barrier diode 5e, and constitutes an arm unit.

The semiconductor module 2f also includes an N-type SiC-MOSFET (an example of a second wide bandgap semiconductor element) 3f, a body diode 4f, and a Schottky barrier diode 5f, and constitutes an arm unit.

The SiC-MOSFETs 3a, 3b, 3c, 3d, 3e, and 3f are unipolar power semiconductor elements, and are bidirectional. Here, the wide bandgap semiconductor elements that constitute the arm units are not limited to SiC-based semiconductor elements, and may instead be wide bandgap semiconductor elements having at least one of gallium nitride and diamond as their primary material. Additionally, the Schottky barrier diodes 5a to 5f are not limited to Si-based semiconductor elements, and may instead be wide bandgap semiconductor elements having at least one of silicon carbide, gallium nitride, and diamond as their primary material. A wide bandgap semiconductor element has high-temperature and high-voltage performance superior to an Si element, and has low loss.

Additionally, the power conversion device 10 includes a gate driving unit (GDU) 1a that controls a switching operation of the semiconductor module 2a, a gate driving unit (GDU) 1b that controls a switching operation of the semiconductor module 2b, a gate driving unit (GDU) 1c that controls a switching operation of the semiconductor module 2c, a gate driving unit (GDU) 1d that controls a switching operation of the semiconductor module 2d, a gate driving unit (GDU) 1e that controls a switching operation of the semiconductor module 2e, and a gate driving unit (GDU) 1f that controls a switching operation of the semiconductor module 2f.

Output terminals of the gate driving units 1a to 1f are connected to corresponding gate terminals G serving as control terminals of the SiC-MOSFETs 3a to 3f.

The semiconductor module 2a and the semiconductor module 2b constitute a U-phase switching arm unit, for example; the semiconductor module 2c and the semiconductor module 2d constitute a V-phase switching arm unit, for example; and the semiconductor module 2e and the semiconductor module 2f constitute a W-phase switching arm unit, for example. Accordingly, an inverter circuit is constituted by a three-phase full bridge circuit in which the U-phase switching arm unit, the V-phase switching arm unit, and the W-phase switching arm unit are connected in parallel, the gate driving units 1a and 1b that control switching operations of the U-phase arm, the gate driving units 1c and 1d that control switching operations of the V-phase arm, and the gate driving units 1e and 1f that control switching operations of the W-phase arm.

Next, the semiconductor device according to the present embodiment will be described using FIGS. 2 to 5, with reference to FIG. 1, using the U-phase switching arm unit as an example. Note that the V-phase switching arm unit and the W-phase switching arm unit have the same configuration as the U-phase switching arm unit.

Figure 2:
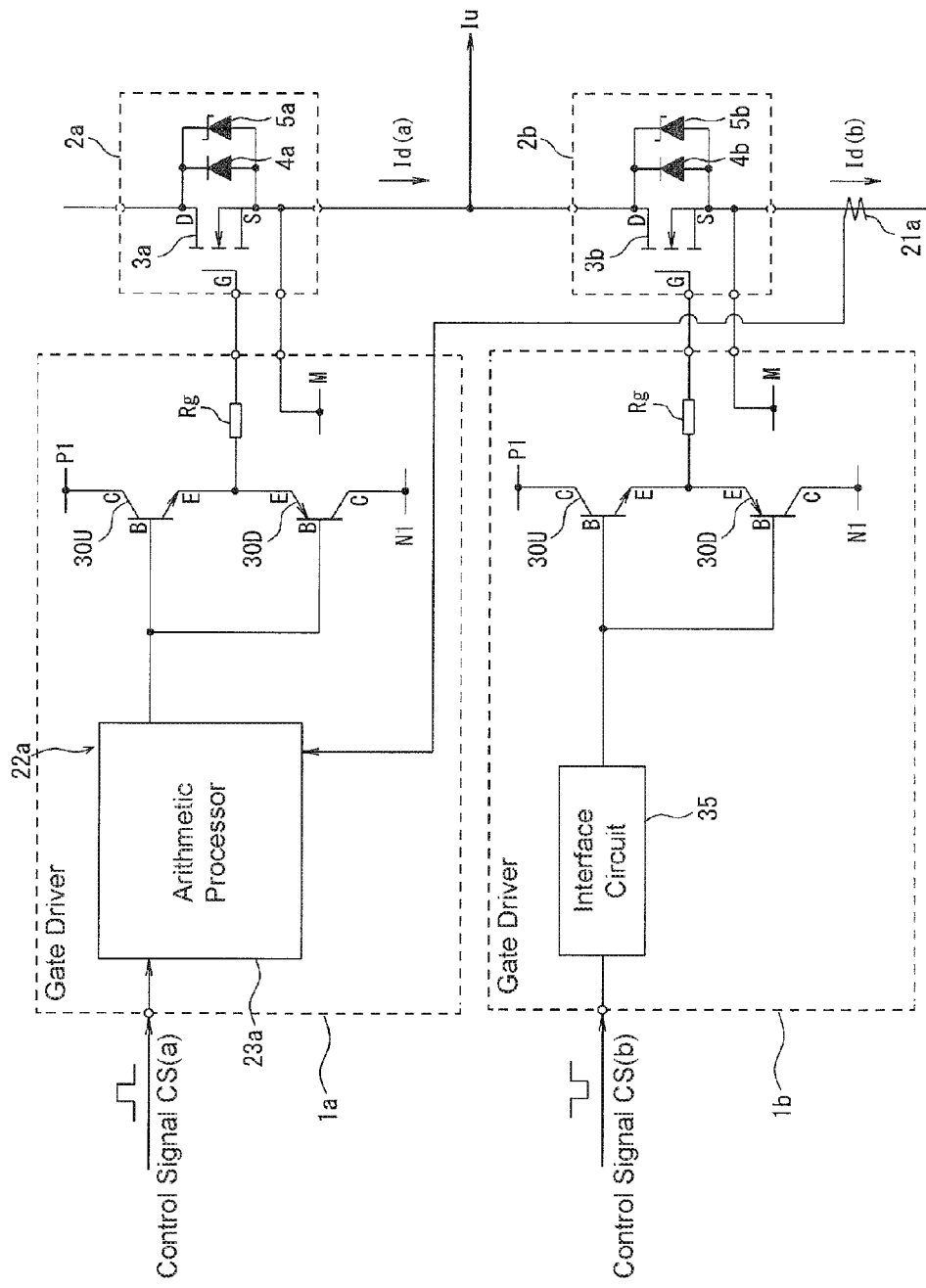
FIG. 2 is a block diagram illustrating an example of a semiconductor device according to the present invention.

As illustrated in FIG. 2, the gate driving unit 1a includes a current sensor 21a serving as a current detecting unit that detects a drain current (an example of a main current) Id(b) flowing in the SiC-MOSFET 3b, which corresponds to a second wide bandgap semiconductor element, and a gate driving unit 22a serving as a semiconductor element driving unit that drives the SiC-MOSFET 3a, which corresponds to a first wide bandgap semiconductor element, in response to the input of a current value of the drain current Id(b) detected by the current sensor 21a.

The gate driving unit 22a includes a processing unit 23a serving as a first driving unit, constituted by a microcomputer, for example, inputted with an upper arm control signal CS(a) from the exterior.

The drain current Id(b), detected by the current sensor 21a, of the SiC-MOSFET 3b corresponding to the second wide bandgap semiconductor element is inputted to the processing unit 23a.

Figure 3:
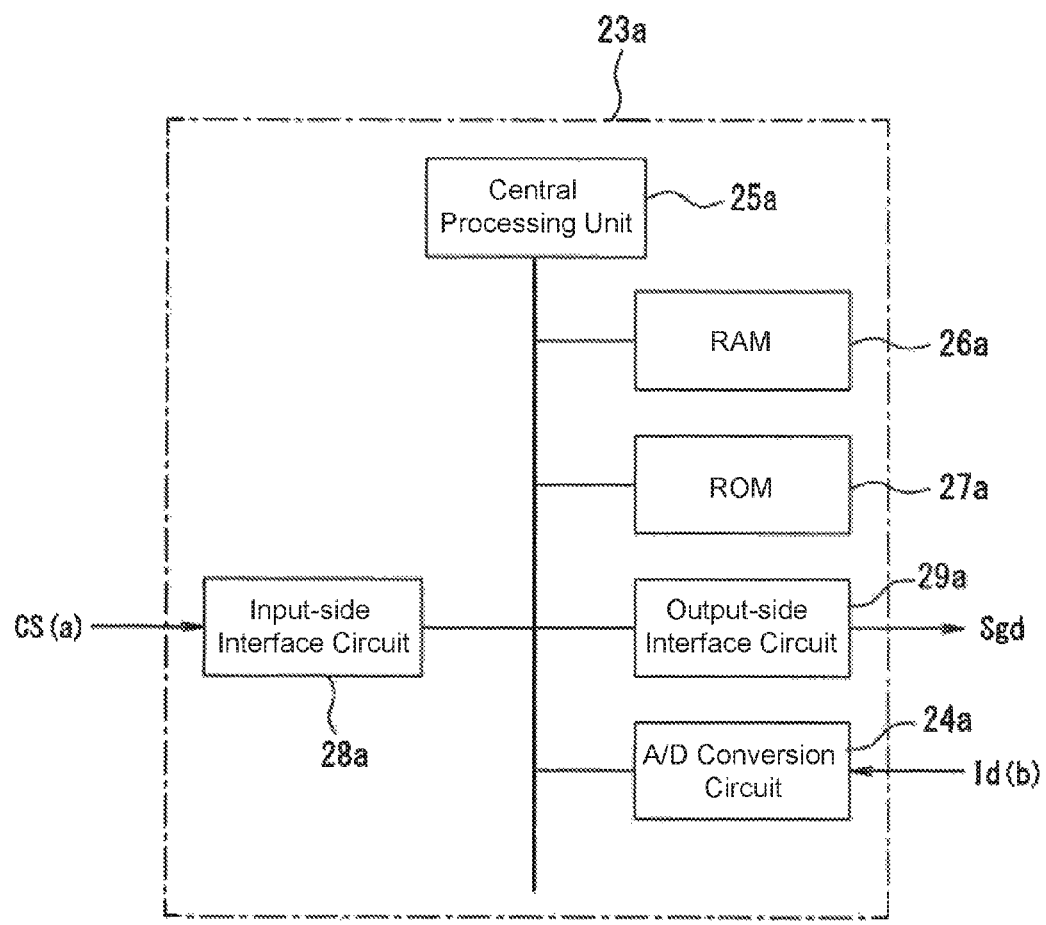
FIG. 3 is a block diagram illustrating in detail the configuration of a processing unit illustrated in FIG. 2.

Meanwhile, as illustrated in FIG. 3, the processing unit 23a includes a central processing unit (CPU) 25a. A RAM 26a and a ROM 27a, as well as an input-side interface circuit 28a, an A/D conversion circuit 24a, and an output-side interface circuit 29a, are connected to the central processing unit 25a by a system bus. A gate driving signal Sgd(a) outputted from the output-side interface circuit 29a is supplied to a base of a first switching element 30U constituted by an NPN-type bipolar transistor and a base of a second switching element 30D constituted by a PNP-type bipolar transistor, which are connected in series between a positive pole source P1 and a negative pole source N1 of an AC power source. A connection point between the first switching element 30U and the second switching element 30D is connected to a gate of the SiC-MOSFET 3a via a gate resistance Rg.

Figure 4:
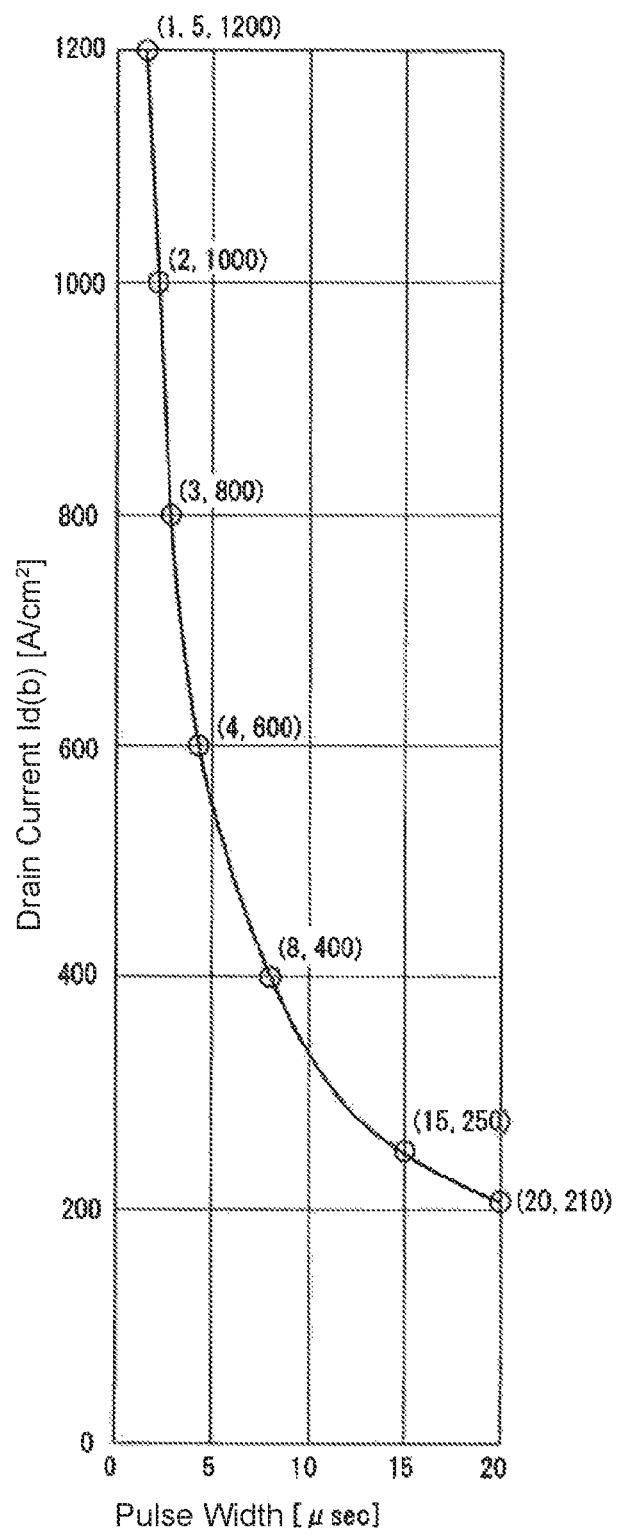
FIG. 4 is a fault inhibiting characteristic map illustrating a relationship between a pulsewidth used in the processing unit and a drain current.

A fault inhibiting characteristic map is stored in the ROM 28b in advance. As illustrated in FIG. 4, this fault inhibiting characteristic map takes a pulsewidth of a pulse-form current produced when a flyback current begins flowing in the body diode 4b of the SiC-MOSFET 3b serving as a second wide bandgap semiconductor element on the horizontal axis, and the drain current Id(b) resulting from the flyback current on the horizontal axis; a hyperbolic fault inhibiting characteristic curve L1 indicating a border between a fault growth region 31 and a fault inhibiting region 32 of the SiC-MOSFET is set.

In this fault inhibiting characteristic map, a pulsewidth PW is set to approximately 30% of a dead time Tdt between the control signal CS(a) of the SiC-MOSFET 3a serving as the first wide bandgap semiconductor element and a control signal CS(b) of the SiC-MOSFET 3b, and thus detecting the dead time Tdt makes it possible to calculate the pulsewidth PW (=0.3×Tdt).

Figure 5:
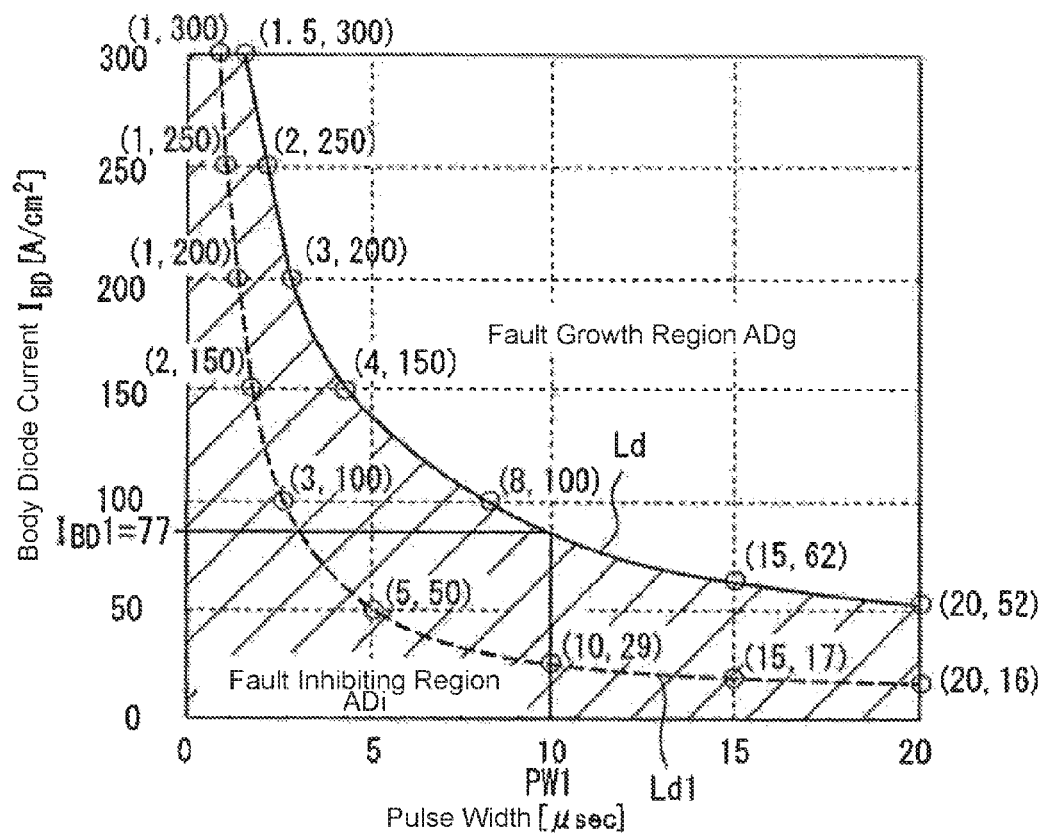
FIG. 5 is a fault inhibiting characteristic map illustrating a relationship between a pulsewidth and a body diode current.

This fault inhibiting characteristic map is obtained by converting a flyback current $I_{BD}$ of the body diode 4b as indicated in the fault inhibiting characteristic map illustrated in FIG. 5, which represents a relationship between the pulsewidth and the flyback current of the body diode 4b, into the drain current Id(b). In the fault inhibiting characteristic map illustrated in FIG. 5, when the pulsewidth takes the horizontal axis and the flyback current $I_{BD}$ of the body diode 4b takes the vertical axis, a hyperbolic fault inhibiting characteristic curve Ld indicating a border between a fault growth region and a fault inhibiting region is set.

A region on an origin (0,0) side of the fault inhibiting characteristic line Ld corresponds to a fault inhibiting region ADi, whereas a side of the fault inhibiting characteristic line Ld opposite from the origin (0,0) corresponds to a fault growth region ADg. The fault inhibiting characteristic line Ld is derived from the results of experiments, simulations, and so on.

Accordingly, in FIG. 5, when the pulsewidth is PW1=10 (μsec), for example, a flyback current $I_{BD}$ of the body diode 4b no greater than $I_{BD}1=77$ (A/cm$^2$) falls within the fault inhibiting region ADi. Accordingly, stacking faults are inhibited from growing, the on-state resistance of the SiC-MOSFET 3b is inhibited from rising, and conduction loss is inhibited from increasing in the case where a flyback current $I_{BD}$ of less than or equal to $I_{BD}1=77$ (A/cm$^2$) flows in the body diode 4b.

On the other hand, when the pulsewidth is PW1=10 (μsec), a flyback current $I_{BD}$ of more than $I_{BD}1=77$ (A/cm$^2$) falls within the fault growth region ADg. Accordingly, stacking faults grow, the on-state resistance of the SiC-MOSFET 3b rises, and conduction loss increases when a flyback current $I_{BD}$ exceeding $I_{BD}1=77$ (A/cm$^2$) flows in the body diode 4b.

Accordingly, by driving the SiC-MOSFET 3a on the upper arm side so that coordinates expressed by the pulsewidth and the flyback current $I_{BD}$ of the body diode 4b are within the fault inhibiting region ADi, energy stored in a U-phase coil Lu of the three-phase electric motor 17 while the SiC-MOSFET 3a is turned on can inhibit flyback current flowing in the body diode 4b on the lower arm side when the SiC-MOSFET 3a turns off, making it possible to control the driving while inhibiting the growth of stacking faults.

As expressed by the following Formula (1), of the flyback current $I_{BD}$ of the body diode 4b and the drain current Id(b), the drain current Id(b) is a value obtained by multiplying an inductance ratio $L_{MOS}/L_{SBD}$ between a flyback inductance $L_{MOS}$ of the SiC-MOSFET 3a and a flyback inductance $L_{SBD}$ of the Schottky barrier diode 5a by the flyback current $I_{BD}$ of the body diode.

$$Id(b)=(L_{MOS}/L_{SBD})\times I_{BD}\times I_{BD} \quad (1)$$

Accordingly, the drain current Id(b) (A/cm$^2$) is calculated from Formula (1) and the fault inhibiting characteristic map illustrated in FIG. 4 is formed.

Figure 6:
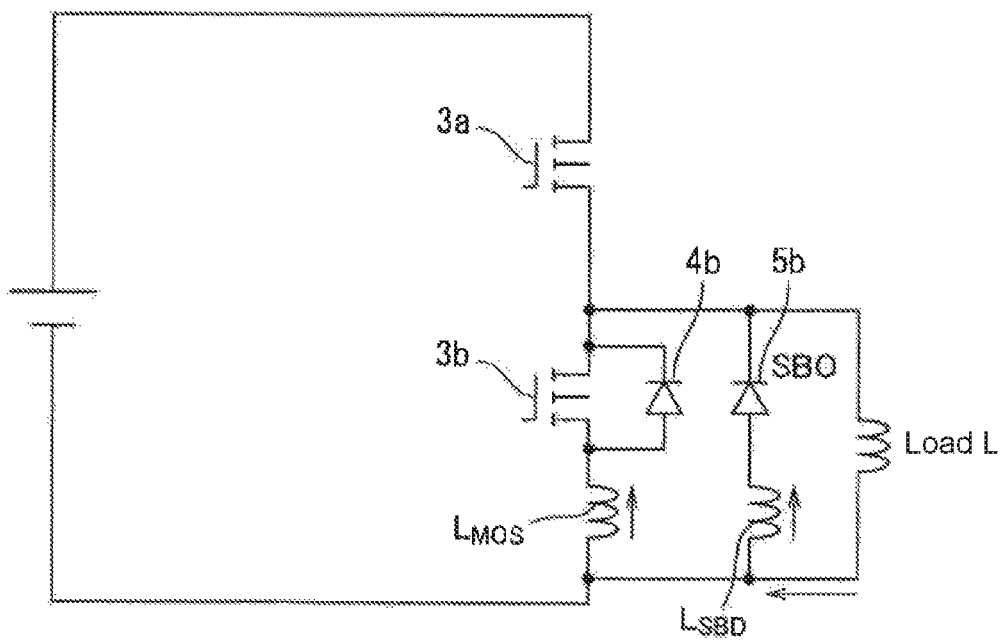
FIG. 6 is an equivalent circuit diagram of a switching arm.

Here, when the SiC-MOSFET 3a turns off and a flyback current flows in the SiC-MOSFET 3b corresponding to the lower arm, an equivalent circuit is established as illustrated in FIG. 6; the flyback current Id(b) from the U-phase coil Lu of the three-phase electric motor 17 traverses the inductance $L_{MOS}$, traverses the body diode 4b and returns to the U-phase coil Lu, and traverses the inductance $L_{BD}$, traverses the Schottky barrier diode 5b, and returns to the U-phase coil Lu.

Figure 7:
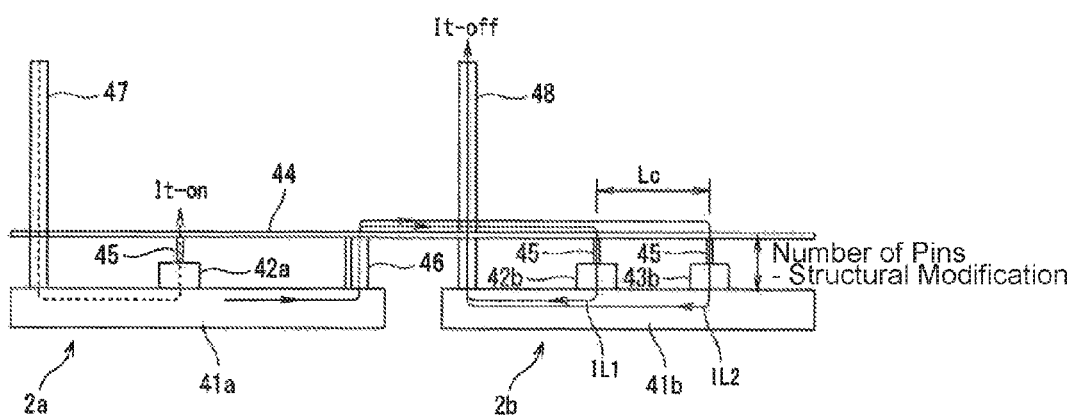
FIG. 7 is a schematic diagram illustrating a current path in the case where a switching arm is constituted by semiconductor modules.

A current path in the modules is as indicated in FIG. 7 when the SiC-MOSFET 3a is turned off. That is, the semiconductor module 2a is formed, for example, by surface-mounting a SiC-MOSFET chip 42a on an upper surface of a substrate 41a in which a conductive plate portion is bonded to an insulative substrate as with a DCB (Direct Copper Bond) substrate, with a drain electrode facing the substrate. In the semiconductor module 2b, a SiC-MOSFET chip 42b and a Schottky barrier diode chip 43b are surface-mounted on an upper surface of a substrate 41b that is the same type of substrate as the substrate 41a, with a drain of the SiC-MOSFET chip 42b and a cathode of the Schottky barrier diode chip 43b separated by a prescribed distance Lc.

A printed board 44 is disposed above the substrates 41a and 41b; the printed board 44 is electrically connected to a source electrode and a gate electrode formed on upper surfaces of the SiC-MOSFET chips 42a and 42b and an anode electrode formed on an upper surface of the Schottky barrier diode 43b by conductive pins 45. Additionally, the substrate 41a of the semiconductor module 2a and the printed board 44 are electrically connected by a conductive pin 46. Furthermore, a positive terminal pin 47 connected to the positive line Lp is connected to the upper surface of the substrate 41a of the semiconductor module 2a, and an output terminal pin 48 connected to the U-phase coil Lu of the three-phase electric motor 17 is connected to the upper surface of the substrate 41b of the semiconductor module 2b.

When the SiC-MOSFET 3a of the semiconductor module 2a turns on, a turn-on current path is formed as indicated by the dotted line in FIG. 7, in which a current supplied from the positive terminal pin 47 traverses the conductive plate portion of the substrate 41a, the drain-source of the SiC-MOSFET 3a, the conductive pin 45, a printed wiring of the printed board 44, and proceeds toward the U-phase coil Lu of the three-phase electric motor 17 from the output terminal pin 48.

On the other hand, when the SiC-MOSFET 3a of the semiconductor module 2a turns off, two types of turn-off current paths, or in other words, flyback current paths, are formed as indicated by the solid lines in FIG. 7, namely a first current path IL1 in which a flyback current supplied from another end of the U-phase coil Lu of the three-phase electric motor 17 traverses the body diode 4b of the MOSFET 3b, and a second current path IL2 in which the stated flyback current traverses the Schottky barrier diode 5b.

The first current path IL1 extends from the substrate 41a of the semiconductor module 2a to the printed board 44 through the conductive pin 46. The current transmitted to the printed board 44 follows a current path that traverses the printed board, the conductive pins 45, and traverses the drain from the source of the SiC-MOSFET 3b of the semiconductor module 2b, and furthermore traverses the conductive plate portion of the substrate 41b and returns to the U-phase coil Lu of the three-phase electric motor 17 from the output terminal pin 48.

The second current path IL2 is a current path in which the current is transmitted from the substrate 41a of the semiconductor module 2a to the printed board 44 through the conductive pin 46, traverses the printed wiring of the printed board, traverses the conductive pins 45 and travels from the anode to the cathode of the Schottky barrier diode 5b of the semiconductor module 2b, furthermore traverses the conductive plate portion of the substrate 41b, and returns to the U-phase coil Lu of the three-phase electric motor 17 from the output terminal pin 48.

Here, of the flyback current paths, an inductance of the first current path IL1 traversing the SiC-MOSFET 3b is a module inductance $M_{LMOS}$, and an inductance of the second current path traversing the Schottky barrier diode 5b is a module inductance $M_{LSBD}$.

Assuming a chip inductance of the SiC-MOSFET 3b itself is represented by $C_{MOSL}$, a chip inductance of the Schottky barrier diode 5b itself is represented by $C_{LSBD}$, and furthermore, an external inductance is represented by $B_{LMOS}$, the inductance $L_{MOS}$ of the SiC-MOSFET 3a and the inductance $L_{SBD}$ of the Schottky barrier diode 5a can be expressed through the following Formula (2) and Formula (3).

$$L_{MOS} = B_{LMS} + M_{LMOS} + C_{LMOS} \quad (2)$$

$$L_{SBD} = B_{LMS} + M_{LSBD} + C_{LSBD} \quad (3)$$

The module inductance $M_{LMOS}$ is determined by the position in the semiconductor module 2b where the SiC-MOSFET chip 42b is disposed on the conductive plate portion of the substrate 41b, and the number, thickness, and so on of the conductive pins 45; likewise, the module inductance $M_{LSBD}$ is determined by the position in the semiconductor module 2b where the Schottky barrier diode chip 43b is disposed on the conductive plate portion of the substrate 41b, and the number, thickness, and so on of the conductive pins 45.

Accordingly, the module inductances $M_{LMOS}$ and $M_{LSBD}$ are determined at the design stage of the semiconductor module 2b. Here, the module inductance $M_{LMOS}$ is no greater than 10 nH, and the module inductance $M_{LSBD}$ is also no greater than 10 nH. Additionally, the external inductance $B_{LMS}$ is no greater than 10 nH, the chip inductance $C_{LMOS}$ is no greater than 20 nH, and the chip inductance $C_{LSBD}$ is no greater than 5 nH.

Accordingly, the inductance $L_{MOS}$ is a maximum of 10 nH+10 nH+20 nH=40 nH, and the inductance $L_{SBD}$ is a maximum of 10 nH+10 nH+5 nH=25 nH.

Accordingly, assuming that the inductance $L_{MOS}$ is 40 nH and the inductance $L_{SBD}$ is 10 nH, the inductance ratio $L_{MOS}/L_{SBD}$=40 nH/10 nH=4; in the case where the drain current Id(b) is 50 A, $50A \times (L_{MOS}/(L_{MOS}+L_{SBD})) = I_{SBD}$, and a current of 40 A flows on the SBD side and 10 A in the MOS body diode.

As a result, the fault inhibiting characteristic map illustrated in FIG. 4, which takes the drain current Id(b) on the vertical axis, has its vertical axis extended to four times the vertical axis in the fault inhibiting characteristic map illustrated in FIG. 5, which takes the flyback current $I_{BD}$ of the body diode 4b on the vertical axis.

Then, by setting 30% of the dead time Tdt between the control signal CS(a) that drives the SiC-MOSFET 3a and the control signal CS(b) that drives the SiC-MOSFET 3b as the pulsewidth PW, the pulsewidth PW can be detected without actually measuring the pulsewidth of the body diode 4b; whether the drain current Id(b) falls within the fault inhibiting region ADi or falls within the fault growth region ADg can be determined with ease from the detected pulsewidth PW and the drain current Id(b), detected by the current sensor 21a, of the SiC-MOSFET 3b serving as the second wide bandgap semiconductor element.

Figure 8:
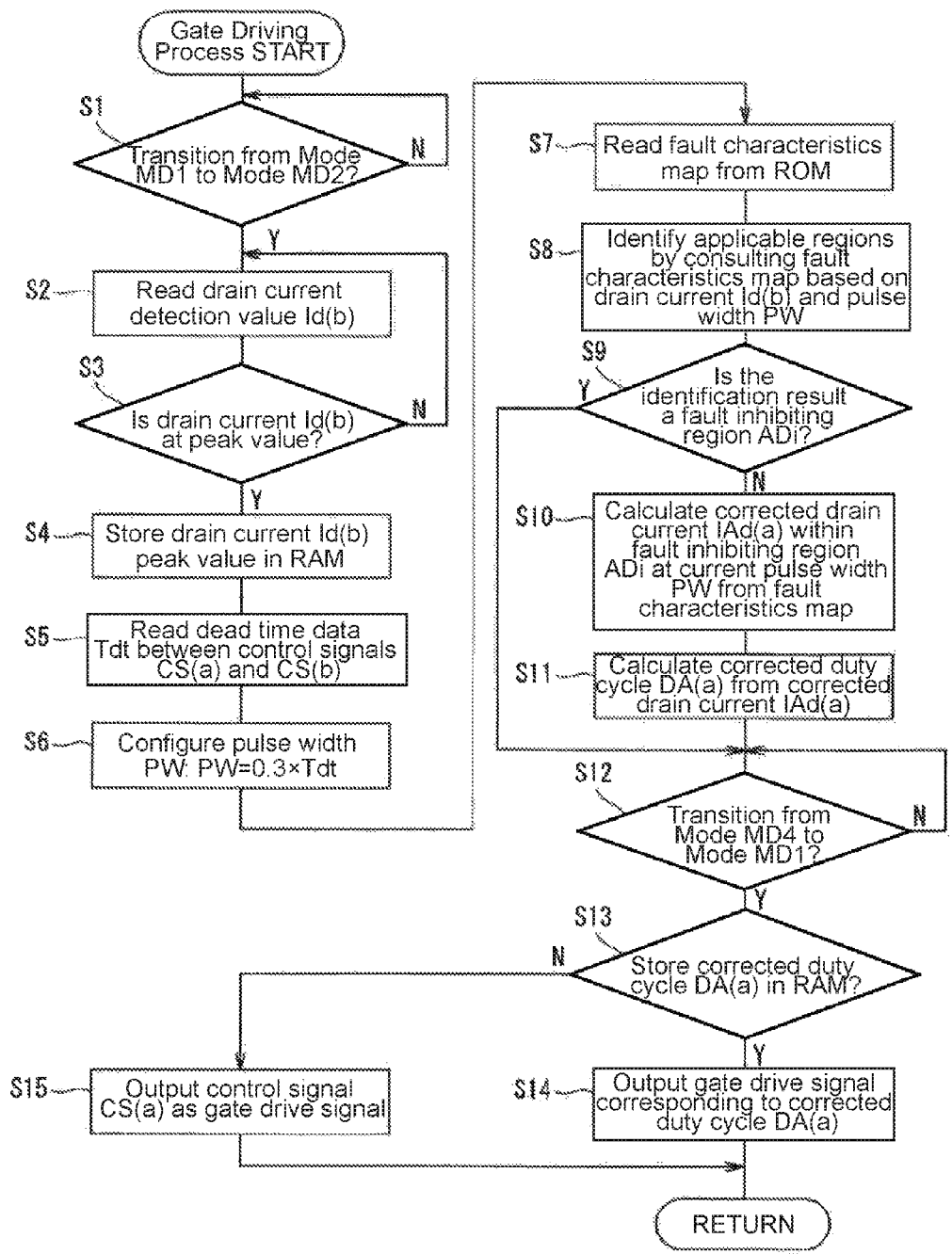
FIG. 8 is a flowchart illustrating an example of a sequence of a gate driving process executed by the processing unit illustrated in FIG. 2.

Accordingly, by the central processing unit 25a of the processing unit 23a executing a gate driving process illustrated in FIG. 8, the driving of the SiC-MOSFET 3a can be controlled so that the pulsewidth PW and the flyback current $I_{BD}$ of the body diode 4b fall within the fault inhibiting region ADi.

That is, in the gate driving process, as illustrated in FIG. 8, it is first determined, in step S1, whether or not the SiC-MOSFET 3a has transitioned from a mode MD1, indicated in FIGS. 10A to 10G, in which the SiC-MOSFET remains turned on, to a mode MD2, indicated in FIGS. 10A to 10G, in which the SiC-MOSFET is turned off. When the SiC-MOSFET has not yet transitioned to the mode MD2, the process stands by until the transition is made. When the SiC-MOSFET has transitioned to the mode MD2, the process moves to step S2, where a negative drain current Id(b) produced by the flyback current detected by the current sensor 21a is loaded. The process then moves to step S3.

In step S3, it is determined whether or not the drain current Id(b) has reached a peak value. When the drain current Id(b) has not reached the peak value, the process stands by until the peak value is reached. When the peak value is reached, the process moves to step S4, where the peak value is temporarily stored in the RAM 26a, for example, after which the process moves to step S5.

In step S5, the dead time Tdt, detected by a dead time detection process that detects the dead time Tdt between the control signal CS(a) and the control signal CS(b), is loaded. The process then moves to step S6, where 30% of the dead time Tdt is set to the pulsewidth PW (=0.3×Tdt), after which the process moves to step S7.

In step S7, the fault characteristics map illustrated in FIG. 4 is loaded from the ROM 27a. The process then moves to step S8, where it is judged whether coordinates corresponding to the peak value of the drain current Id(b) and the pulsewidth PW fall within the fault inhibiting region ADi or fall within the fault growth region ADg by referring to the fault characteristics map on the basis of the peak value of the drain current Id(b) and the pulsewidth PW. The process then moves to step S9.

In step S9, it is determined, as a result of the judgment, whether or not the coordinates fall within the fault inhibiting region ADi. In the case where the coordinates fall within the fault inhibiting region ADi, the process moves directly to step S12 without calculating a corrected duty ratio for the control signal CS(a). In the case where the result of the judgment indicates that the coordinates fall within the fault growth region ADg, the process moves to step S10, where a corrected drain current IAd(b) for the SiC-MOSFET 3b that falls within the fault inhibiting region ADi at the same pulsewidth PW is calculated. The process then moves to step S11.

In step S11, a corrected duty ratio DA(a) of the control signal CS(a), corresponding to the calculated corrected drain current IAd(b), is calculated, and the process then moves to step S12.

In step S12, it is determined whether or not the SiC-MOSFET 3a in the upper arm has transitioned from a mode MD4, in which the SiC-MOSFET is turned off, to the mode MD1, in which the SiC-MOSFET is turned on. When the SiC-MOSFET has not yet transitioned to the mode MD1, the process stands by until the transition occurs, and when the SiC-MOSFET has transited to the mode MD1, the process moves to step S13.

In step S13, it is determined whether or not the corrected duty ratio DA(a) is stored in a corrected duty ratio storage region of the RAM 26a. When the corrected duty ratio DA(a) is stored, the process moves to step S14, where a gate driving signal of a pulsewidth based on the corrected duty ratio DA(a) is outputted instead of the control signal CS(a), and the process then returns to step S1. When the corrected duty ratio DA(a) is not stored, the control signal CS(a) is outputted as-is as the gate driving signal, after which the process returns to step S1.

Figure 9:
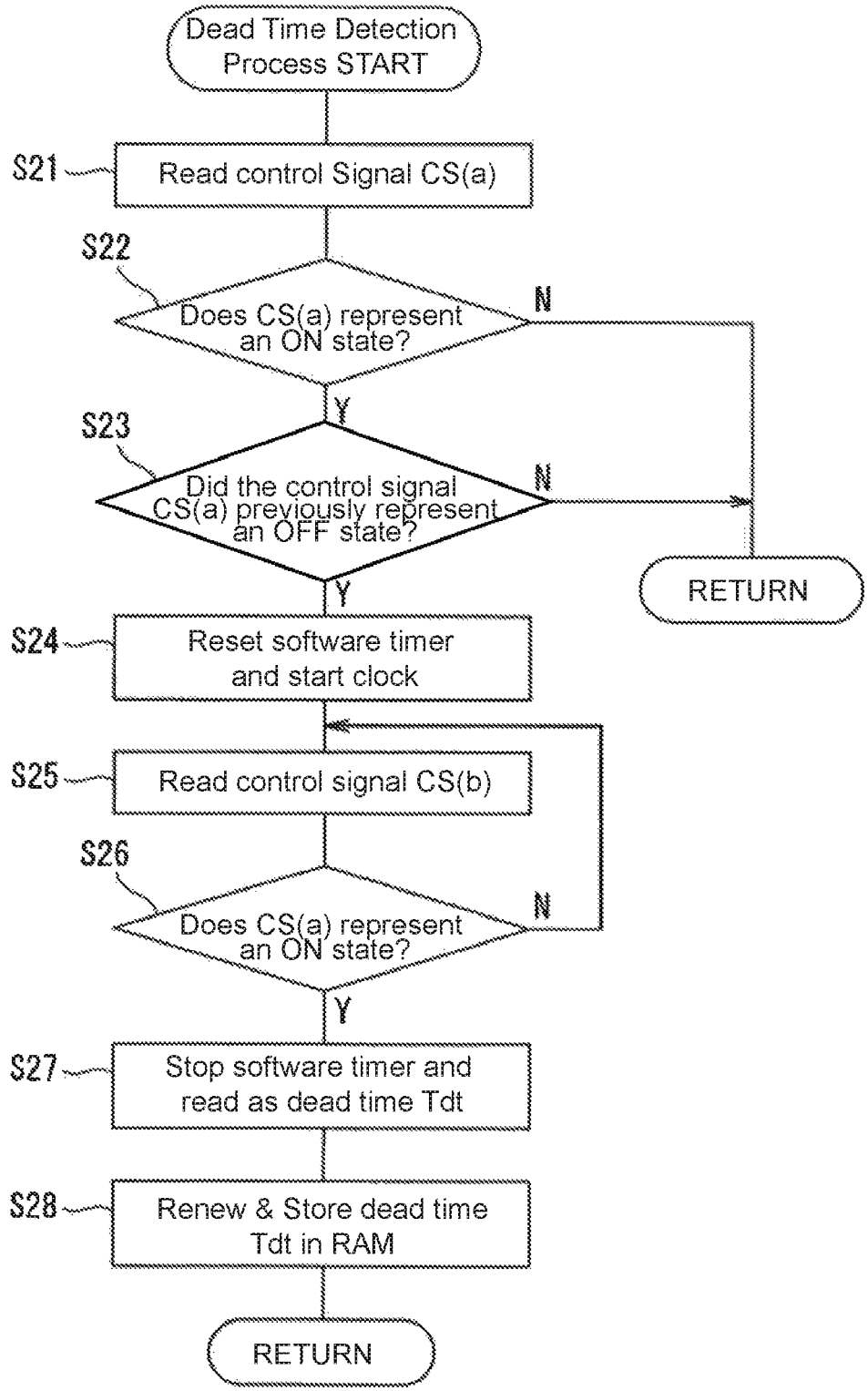
FIG. 9 is a flowchart illustrating an example of a sequence of a dead time detection process executed by the processing unit illustrated in FIG. 2.

The central processing unit 25a of the processing unit 23a executes the dead time detection process. As illustrated in FIG. 9, this dead time detection process is executed as a timer interrupt process every prescribed amount of time (100 nsec, for example). First, in step S21, the control signal CS(a) is loaded. The process then moves to step S22, where it is determined whether or not the control signal CS(a) is in an on state. When the control signal CS(a) is in an off state, the timer interrupt process is ended directly and the process returns to a prescribed main program, whereas when the control signal CS(a) is in an on state, the process moves to step S23.

In step S23, it is determined whether or not the previous value of the control signal CS(a) was an off state. When the previous value was an on state, it is determined that the on state is being maintained, the timer interrupt process ends directly and the process returns to the prescribed main program.

When the result of the determination made in step S23 indicates that the previous value of the control signal CS(a) was in an off state, it is determined that the state has switched from an off state to an on state, and the process moves to step S24.

In step S24, a software timer is reset and the measurement of time is started anew; the process then moves to step S25.

In step S25, the control signal CS(b) is loaded, and the process then moves to step S26, where it is determined whether or not the state has changed to an on state. In the case where the control signal CS(b) remains in an off state, the process returns to step S25, whereas when the state has changed to an on state, the process moves to step S27, where the software timer is stopped and the measured time is loaded as the dead time Tdt, after which the process moves to step S28.

In step S28, the loaded dead time Tdt is updated and stored in a dead time storage region of the RAM 26a, after which the timer interrupt process is ended and the process returns to the prescribed main program.

In this dead time detection process, the dead time Tdt between the control signal CS(a) and the control signal CS(b) is detected and the detected dead time between the control signal CS(a) and the control signal CS(b) is updated and stored in the dead time storage region of the RAM 26a every prescribed amount of time, and thus the most recent dead time Tdt is always stored in the dead time storage region of the RAM 26a.

Accordingly, the pulsewidth PW can be calculated on the basis of the most recent dead time in the gate driving process described above with reference to FIG. 8, and by referring to the fault characteristics map on the basis of the calculated pulsewidth PW and the detected drain current Id(b), a gate driving signal can be formed such that the current drain current Id(b) falls within the fault inhibiting region ADi.

By controlling the gate of the SiC-MOSFET 3a, which serves as the first wide bandgap semiconductor element, using this gate driving signal, the electrical energy stored in the U-phase coil Lu of the three-phase electric motor 17 can be controlled to an appropriate value, and the flyback current flowing in the body diode 4b of the SiC-MOSFET 3b, which serves as the second wide bandgap semiconductor element, can be controlled to a current value that inhibits the growth of stacking faults.

Accordingly, the growth of stacking faults in the SiC-MOSFET 3b can be inhibited, a rise in the on-state resistance can be inhibited, and an increase in conduction loss can be inhibited.

Next, operations performed when applying the gate driving units 1a and 1b will be described with respect to one phase of the power conversion device 10 (the U-phase arm, for example), with reference to FIGS. 10A to 10G. Note that the other two phases not described below (the V phase and W phase, for example) also operate in the same manner as this one phase. The operations in the one phase of the power conversion device 10 are divided into three operations, for the mode MD1, the mode MD2, a mode MD3, and the mode MD4.

In the operations in mode MD1 from time t11 to time t12 in FIGS. 10A to 10G, the control signal CS(a) inputted to the gate driving unit 1a of the SiC-MOSFET 3a is at high level, as indicated in FIG. 10A, and the control signal CS(b) inputted to the gate driving unit 1b of the SiC-MOSFET 3b is at low level, as indicated in FIG. 10B.

Figures 11A, 11B, 11C:
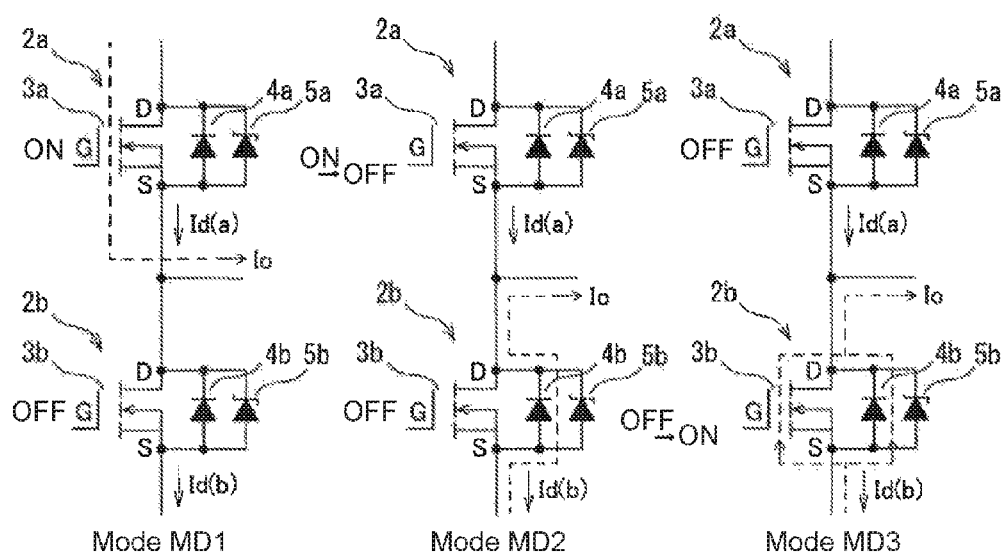
FIGS. 11A to 11C are schematic diagrams illustrating current paths in respective modes of a switching arm, where 11A indicates a mode MD1, 11B indicates a mode MD2, and 11C indicates a mode MD3.

Accordingly, as indicated in FIG. 10C, a gate-source voltage Vgs(a) of the MOSFET 3a is the same voltage as a first power source voltage P1, and as indicated in FIG. 10D, a gate-source voltage Vgs(b) of the SiC-MOSFET 3b is the same voltage as a negative voltage N1. Accordingly, as illustrated in FIG. 11A, the SiC-MOSFET 3a is in an on state, the SiC-MOSFET 3b is in an off state, and a drain current Id(a) of the SiC-MOSFET 3a flows in the U-phase coil of the three-phase electric motor 17 (see FIG. 1) as an output current Iu. The drain current Id(a) of the SiC-MOSFET 3a therefore increases as indicated in FIG. 10F, and the output current Iu gradually increases as indicated in FIG. 10E. The output current Iu has a positive value.

In the mode MD1, the control signal CS(b) inputted to the gate driving unit 1b of the SiC-MOSFET 3b is at low level, as indicated in FIG. 10B, and thus the first switching element 30U is in an off state and the second switching element 30D is in an on state. As a result, the negative voltage N1 is applied to the gate terminal G of the SiC-MOSFET 3b. A reference potential M (0 (V), for example) is being applied to the source terminal S of the SiC-MOSFET 3b, and thus the gate-source voltage Vgs(b) of the SiC-MOSFET 3b matches the negative voltage N1, as indicated in FIG. 10D. Accordingly, a forward bias voltage is not outputted to the gate-source voltage Vgs(b) of the SiC-MOSFET 3b, and the SiC-MOSFET 3b remains in an off state.

The operations for the one phase of the power conversion device then change from the mode MD1 to the mode MD2 at time t12. The mode MD2 is a mode that turns off the SiC-MOSFET 3a and puts both the SiC-MOSFETs 3a and 3b in an off state in order to form a dead time that prevents the SiC-MOSFET 3a and the SiC-MOSFET 3b from being in an on state simultaneously and a through current flowing between the SiC-MOSFET 3a and the SiC-MOSFET 3b. At this time, the control signal CS(a) inputted to the gate driving unit 1a of the SiC-MOSFET 3a switches from high level to low level, as indicated in FIG. 10A, and the control signal CS(b) inputted to the gate driving unit 1b of the SiC-MOSFET 3b stays at low level, as indicated in FIG. 10B.

In the mode MD2, the gate-source voltage Vgs(a) of the SiC-MOSFET 3a and the gate-source voltage Vgs(b) of the SiC-MOSFET 3b are at the same voltage as the negative voltage N1, as indicated in FIGS. 10C and D. Accordingly, as illustrated in FIG. 11B, the SiC-MOSFET 3a switches from an on state to a turned-off state, and the SiC-MOSFET 3b remains in an off state. The SiC-MOSFETs 3a and 3b are thus both in an off state.

At this time, a flyback current from the three-phase electric motor 17 flows to the three-phase electric motor 17, through the body diode 4b and the Schottky barrier diode 5b of the semiconductor module 2b, as the output current Iu, as indicated by the broken line arrow in FIG. 11B. This flyback current is a current based on a discharge of an electric charge accumulated in the coil of the three-phase electric motor 17, and thus as indicated in FIG. 10G, the drain current Id(b), which corresponds to the current value of the flyback current, gradually approaches 0 (A) after an overshoot has temporarily arisen immediately after entering the mode MD2. The current value of the output current Iu gradually drops in response to this, as indicated in FIG. 10E. Additionally, the SiC-MOSFET 3a is in an off state in the mode MD2, and thus the drain current Id(a) of the SiC-MOSFET 3a is 0 (A), as indicated in FIG. 10F.

In this manner, upon transitioning from the mode MD1 to the mode MD2, the central processing unit 25a of the processing unit 23a in the gate driving unit 1a executes the gate driving process illustrated in FIG. 8 and the dead time detection process illustrated in FIG. 9, and thus the dead time Tdt between the control signal CS(a) and the control signal CS(b) can be detected and continually kept updated in the dead time storage region of the RAM 26a through the dead time detection process, as described above.

Meanwhile, the pulsewidth PW can be calculated on the basis of the most recent dead time in the gate driving process, and by referring to the fault characteristics map on the basis of the calculated pulsewidth PW and the detected drain current Id(b), the gate driving signal of the SiC-MOSFET 3a can be formed such that the current drain current Id(b) falls within the fault inhibiting region ADi.

In the case where the drain current Id(b) of the SiC-MOSFET 3b is within the fault growth region ADg, the corrected duty ratio DA(a) is calculated so as to reduce the drain current Id(a) of the SiC-MOSFET 3a. Upon transitioning from the mode MD4 to the mode MD1, the drain current Id(a) is reduced and the electrical energy stored in the U-phase coil Lu of the three-phase electric motor 17 is reduced by controlling the gate of the SiC-MOSFET 3a in the upper arm according to the corrected duty ratio DA(a).

Accordingly, in the next transition from the mode MD1 to the mode MD2, the drain current Id(b), which is the flyback current flowing in the body diode 4b in the lower arm, is reduced and controlled to a flyback current value that falls within the fault inhibiting region ADi.

By controlling the SiC-MOSFET 3a in the upper arm according to the flyback current in the lower arm in this manner, the flyback current flowing in the body diode 4b of the SiC-MOSFET 3b in the lower arm is inhibited and an increase in stacking faults in the SiC-MOSFET 3b is inhibited, which in turn makes it possible to inhibit a rise in the on-state resistance of the SiC-MOSFET 3b and inhibit an increase in conduction loss.

Note that upon transitioning from the mode MD2 to the mode MD3, in which the SiC-MOSFET 3b is in a turned-on state, the SiC-MOSFET 3b enters an on state, and a flyback current also flows through the SiC-MOSFET 3b. The on-state resistances of the SiC-MOSFET 3b, the body diode 4b, and the Schottky barrier diode 5b become parallel, and thus the on-state resistance can be reduced and conduction loss can be reduced.

In the mode MD3, electrons flow through the channel of the SiC-MOSFET 3b. At this time, electron holes entering from the source side do not combine with the electrons, and thus no degradation in the on voltage of the body diode 4b occurs due to recombination energy.

Furthermore, upon transitioning from the mode MD3 to the mode MD4, a dead time period is entered again, resulting in the SiC-MOSFET 3a in the upper arm and the SiC-MOSFET 3b in the lower arm both entering an off state. As in the mode MD2, a flyback current is distributed between the body diode 4b and the Schottky barrier diode 5b at an on-state voltage ratio between the two in the mode MD4. The on-state voltage ratio is higher than a transient on-state voltage ratio of the mode MD2, and the flyback current flowing in the body diode 4b becomes extremely low.

According to the present embodiment as described above, in the case where a switching arm unit is formed by connecting a first wide bandgap semiconductor element and a second wide bandgap semiconductor element in series between the positive line Lp and the negative line Ln, the growth of stacking faults in the second wide bandgap semiconductor element can be inhibited with certainty in a dead time period in which the control signal CS(a) goes from on to a turned-off state and the control signal CS(b) stays in an off state. This makes it possible to inhibit a rise in the on-state resistance, inhibit an increase in conduction loss, and prevent degradation of the second wide bandgap semiconductor element.

Although the foregoing Embodiment 1 describes a case where the fault characteristics map takes the origin side of the characteristic line Ld as the fault inhibiting region ADi as indicated in FIG. 5, the invention is not limited thereto. If a hyperbolic fault inhibiting characteristic curve Ld1 located on the origin side of the characteristic line Ld indicated in FIG. 5 is set and the region on the inner side of the fault inhibiting characteristic curve Ld1 is taken as the fault inhibiting region ADi, the growth of stacking faults can be prevented with more certainty, and degradation of the SiC-MOSFETs 3a and 3b can be prevented with more certainty.

Furthermore, although the foregoing Embodiment 1 describes a case where control is carried out for inhibiting the growth of stacking faults in the SiC-MOSFET on the lower arm by controlling the SiC-MOSFET 3a on the upper arm, the invention is not limited thereto. The same processing may be carried out by the gate driving unit 1b of the SiC-MOSFET 3b in the case where a flyback current flows in the body diode 4a and the Schottky barrier diode 5a of the SiC-MOSFET 3a in the upper arm as well.

Next, Embodiment 2 of a semiconductor device according to the present invention will be described according to FIGS. 12 and 13.

In Embodiment 2, a pulsewidth that inhibits the growth of stacking faults is set according to an inductance ratio that is a ratio between the inductance of a SiC-MOSFET and an inductance of a Schottky barrier diode.

In other words, in Embodiment 2, a net inductance $L_{MOSN}$ constituted by only the module inductance $M_{LMOS}$ and the chip inductance $C_{LMOS}$, excluding the external inductance $B_{LMS}$ from the above-described Formula (2), is set as the inductance of the SiC-MOSFETs 3a and 3b. Likewise, a net inductance $L_{SBDN}$ constituted by only the module inductance $M_{LSBD}$ and the chip inductance $C_{LSBD}$, excluding the external inductance $B_{LMS}$ from the above-described Formula (3), is set as the inductance $L_{SBD}$ of the Schottky barrier diodes 5a and 5b. As such, an inductance ratio is expressed as $L_{MOSN}/L_{SBDN}$.

Figure 12:
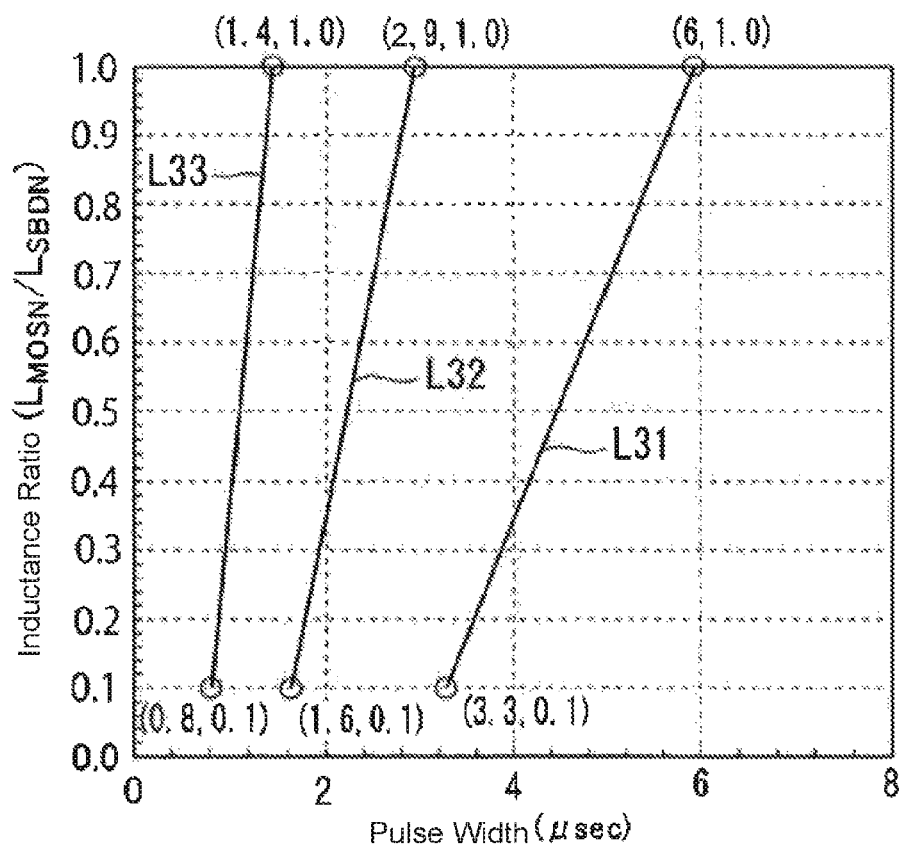
FIG. 12 is a characteristic line map illustrating a relationship between a pulsewidth and an inductance ratio used in Embodiment 2 of the present invention.

Meanwhile, results of various experiments and simulations carried out by the inventors of the present invention and others indicate that to inhibit the growth of stacking faults, a relationship between the pulsewidth PW and the inductance ratio $L_{MOSN}/L_{SBDN}$ may be set as indicated by the characteristic line map in FIG. 12. That is, the characteristic line map in FIG. 12 takes the pulsewidth PW on the horizontal axis and the inductance ratio on the vertical axis, and a case where a maximum current when the drain currents Id(a) and Id(b) flyback (a total of the flyback current flowing in the body diodes 4a and 4b of the SiC-MOSFETs 3a and 3b and the flyback current flowing in the Schottky barrier diode 5a and 5b; the same applies hereinafter) is 5 A is represented by a characteristic line L31, a case where a maximum current when the drain currents Id(a) and Id(b) flyback is 10 A is represented by a characteristic line L32, and a case where a maximum current when the drain currents Id(a) and Id(b) flyback is 20 A is represented by a characteristic line L33.

Here, the characteristic line L33 is represented by a line segment passing through a point (0.8,0.1) and a point (1.4,1.0), the characteristic line L32 is represented by a line segment passing through a point (1.6,0.1) and (2.9,1.0), and the characteristic line L31 is represented by a line segment passing through a point (3.3,0.1) and a point (6,1.0). Sections of the respective characteristic lines L31 to L33 have the same values.

Figure 13:
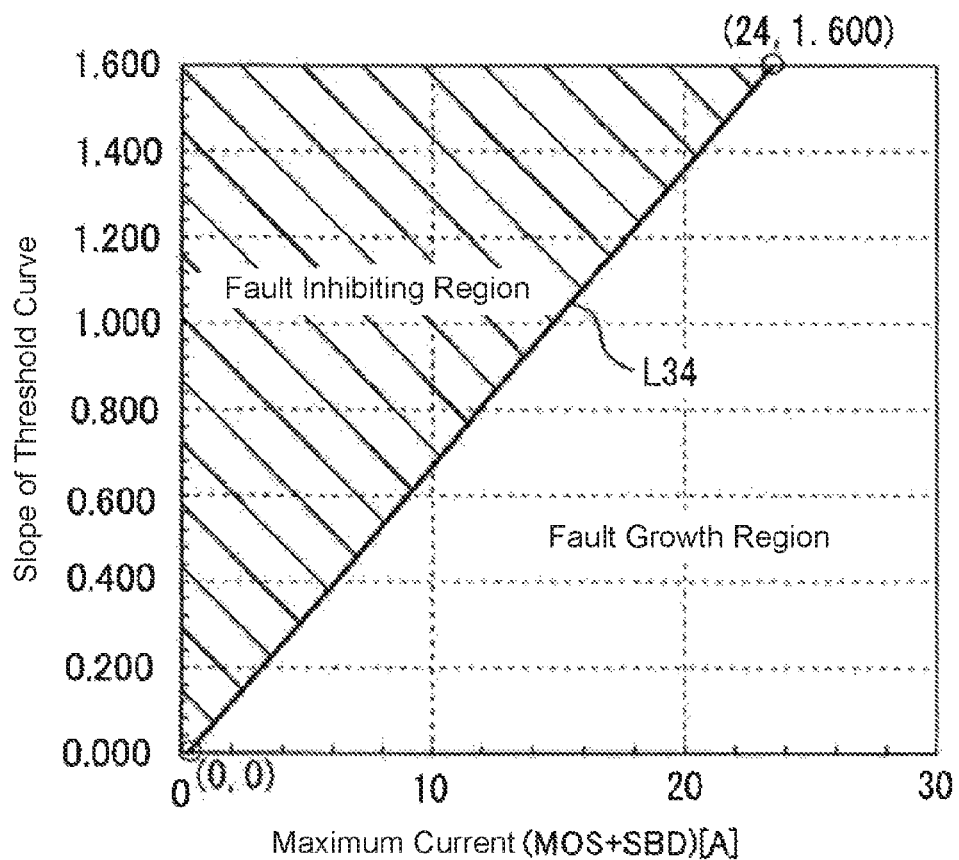
FIG. 13 is a fault inhibiting characteristic line map illustrating a relationship between a maximum current and the slope of a threshold curve, based on FIG. 12.

As such, when a maximum current value Imax is taken on the horizontal axis and slopes of the characteristic lines L31 to L33 in FIG. 12 are taken on the vertical axis, the maximum current value Imax and the slopes of the characteristic lines L31 to L33 are in a linear relationship represented by a characteristic line L34, which is represented by a line segment passing through a point (0,0) and a point (24,1.600), as illustrated in FIG. 13.

A region to the left of the characteristic line L34 is a region in which the slopes of the characteristic lines L31 to L33 in FIG. 12 are greater and a range of selection for the pulsewidth PW narrows, and an effect of inhibiting the growth of stacking faults can be achieved. However, a region to the right of the characteristic line L34 is a region in which the slopes of the characteristic lines L31 to L33 in FIG. 12 are lower and the range of selection for the pulsewidth PW broadens, and is thus a region where the pulsewidth PW that can inhibit the growth of stacking faults is exceeded and stacking faults grow as a result.

Accordingly, the region to the left of the characteristic line L34 in FIG. 13 can be taken as the fault inhibiting region, and the region to the right can be taken as the fault growth region.

Normally, the chip inductance $C_{LSBD}$ of the Schottky barrier diodes 5a and 5b is lower than the chip inductance $C_{LMOS}$ of the SiC-MOSFETs 3a and 3b, and with respect to flyback current, it is easy for flyback current to flow in the body diodes 4a and 4b of the SiC-MOSFETs 3a and 3b. The chip inductances $C_{LMOS}$ and $C_{LSBD}$ are values unique to the semiconductor chip and therefore cannot be adjusted.

On the other hand, the module inductance $M_{LMOS}$ of the SiC-MOSFETs 3a and 3b and the module inductance $M_{LSBD}$ of the Schottky barrier diodes 5a and 5b change at the stage of designing the inductance of wiring within the semiconductor module 2a, and can therefore be adjusted.

As such, an inductance ratio $L_{MOSN}/L_{SBDN}$ in a region that inhibits the growth of stacking faults can be set by adjusting the inductance ratio $L_{MOSN}/L_{SBDN}$ at the design stage of the semiconductor module 2a.

However, the inductance $L_{MOS}$ of the SiC-MOSFETs 3a and 3b and the inductance $L_{SBD}$ of the Schottky barrier diodes 5a and 5b incorporate the external inductance $B_{LMOS}$, as indicated by Formula (2) and Formula (3) in Embodiment 1.

Accordingly, by connecting the external inductance $B_{LMOS}$, even if a pulsewidth PW is set for the semiconductor modules 2a and 2b so as to inhibit stacking faults from growing, connecting the external inductance $B_{LMS}$ will cause a total inductance $L_{MOS}$ and $L_{SBD}$ to change, and the SiC-MOSFETs 3a and 3b can no longer be driven at a pulsewidth that inhibits stacking faults as intended.

As such, in the case where the external inductance $B_{LMS}$ is connected, the inductance ratio $L_{MOS}/L_{SBD}$ is adjusted in the direction where the slopes of the characteristic lines L31 to L33 indicated in FIG. 12 increase, which makes it possible to inhibit the growth of stacking faults, inhibit a rise in the on-state resistance, and inhibit an increase in conduction loss. A method of driving a semiconductor device capable of preventing degradation of the SiC-MOSFETs 3a and 3b can be provided as a result.

Next, Embodiment 3 of a semiconductor device according to the present invention will be described according to FIGS. 14 and 15.

Embodiment 3 focuses on the inductance ratio $L_{MOS}/L_{SBD}$ between the SiC-MOSFET 3a and the Schottky barrier diode 5a serving as the upper arm unit and the inductance ratio $L_{MOS}/L_{SBD}$ between the SiC-MOSFET 3b and the Schottky barrier diode 5b serving as the lower arm unit in the semiconductor module 2a that constitutes the power conversion device 10, and makes it possible to drive the SiC-MOSFETs 3a and 3b within the fault inhibiting region ADi in which stacking faults do not grow, in the same manner as in Embodiment 1.

According to Embodiment 3, a customer who has purchased the power conversion device 10 or the semiconductor modules 2a to 2c can use the power conversion device 10 or the semiconductor modules 2a to 2c without any degradation arising.

Figure 14:
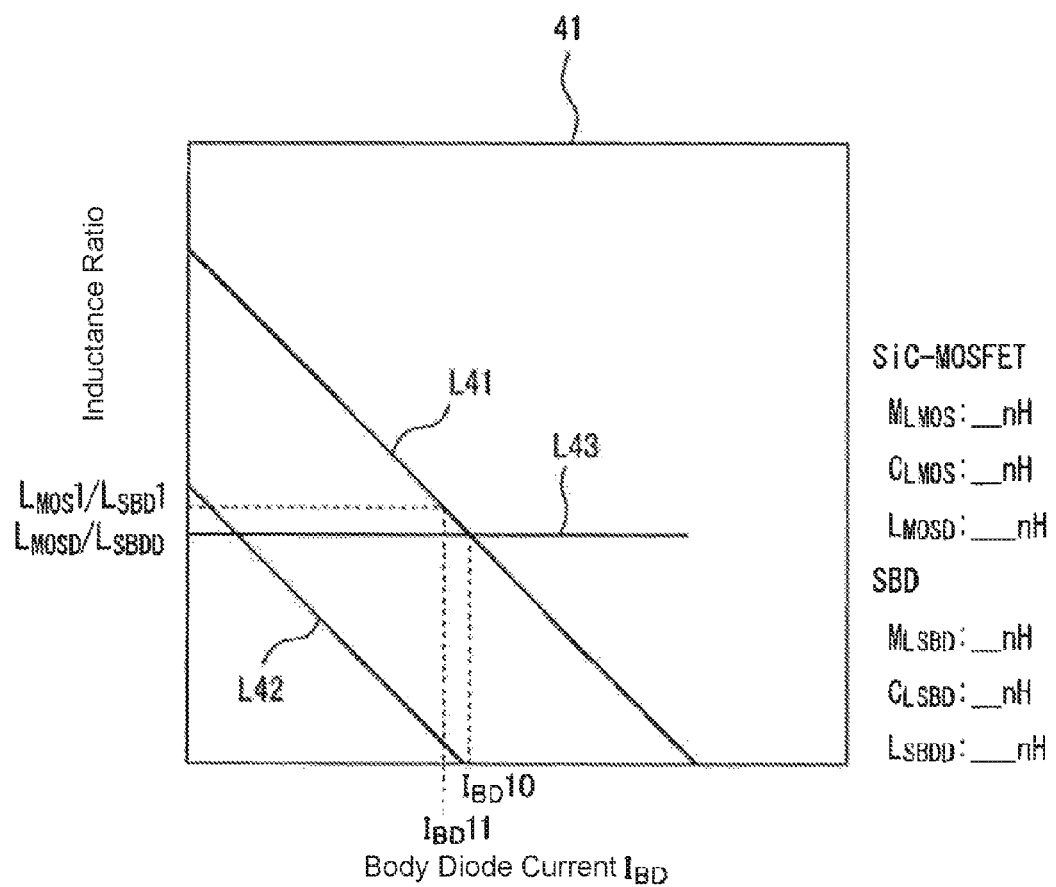
FIG. 14 is a body diode current calculation characteristic line map illustrating a relationship between a body diode current and an inductance ratio used in Embodiment 3 of the present invention.
Figure 15:
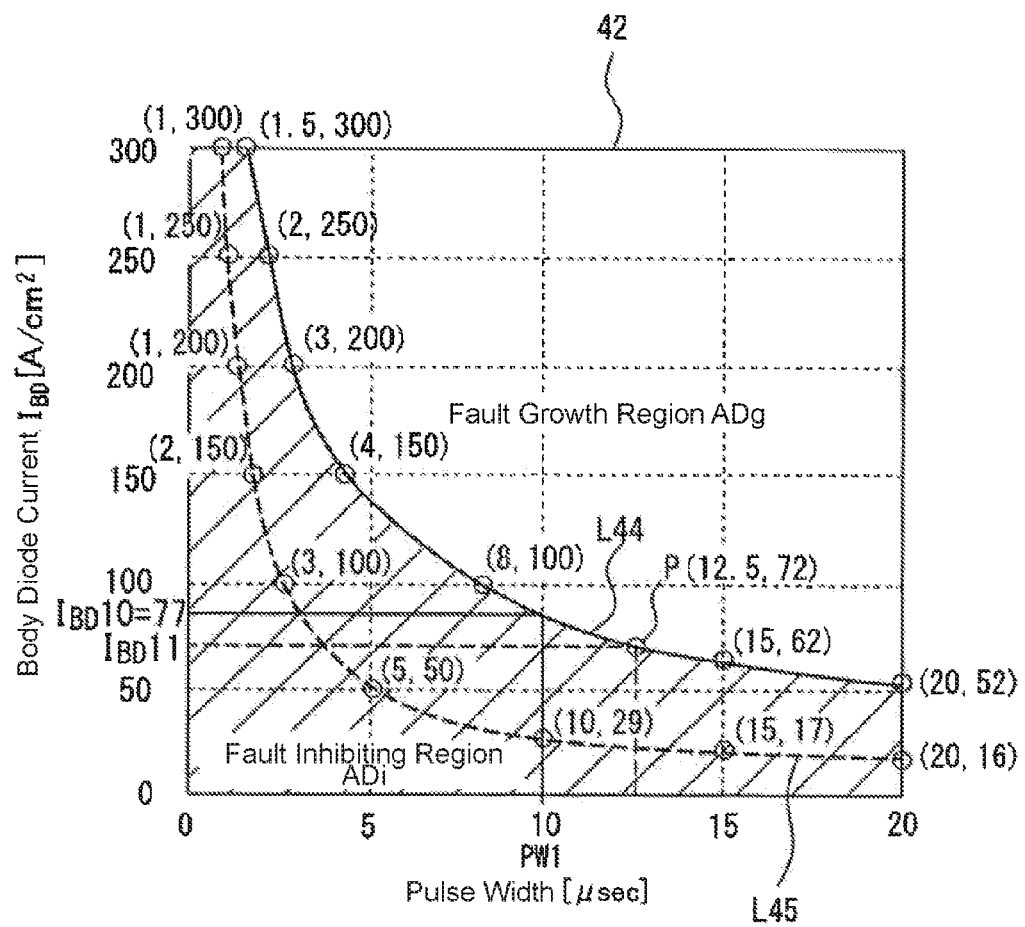
FIG. 15 is a fault inhibiting characteristic map illustrating a relationship between a pulsewidth and a body diode current used in Embodiment 3.

In Embodiment 3, a body diode current calculation characteristic line map 41, illustrated in FIG. 14, and a fault characteristic line map 42, illustrated in FIG. 15, are prepared first.

As illustrated in FIG. 14, the body diode current calculation characteristic line map 41 takes the body diode current $I_{BD}$ on the horizontal axis and the inductance ratio $L_{MOS}/L_{SBD}$ on the vertical axis, and for example, the drain current Id(b) flowing in the body diode 4b and the Schottky barrier diode 5b of the SiC-MOSFET 3b that constitutes the lower arm unit is set as a parameter. In other words, a slope characteristic line L41 for the case where the drain current Id(b) of the SiC-MOSFET 3b is Id1 (30 A, for example) and a slope characteristic line L42 for when the drain current Id(b) of the SiC-MOSFET 3b is Id2, which is lower than Id1 (<Id1) (10 A, for example), are indicated in the body diode current calculation characteristic line map 41. A straight line L43 indicating a recommended inductance ratio $L_{MOSD}/L_{SBDD}$ determined at the design stage of the semiconductor module 2a is set as well. The module inductance $M_{LMOS}$, the chip inductance $C_{LMOS}$, and a recommended inductance $L_{MOSD}$ of the SiC-MOSFET 3b, determined at the design stage, and the module inductance $M_{LSBD}$, the chip inductance $C_{LMOS}$, and a recommended inductance $L_{SBDD}$ of the Schottky barrier diode 5a, are indicated in this body diode current calculation characteristic line map 41. These items are not limited to being indicated in the body diode current calculation characteristic line map 41, and may be indicated in other papers as well.

The fault characteristic line map 42 illustrated in FIG. 15, meanwhile, has the same format as the fault characteristics map described earlier in Embodiment 1 with reference to FIG. 5; the pulsewidth is taken on the horizontal axis, the body diode current $I_{BD}$ of the body diode 4b is taken on the vertical axis, and a hyperbolic fault inhibiting characteristic curve L44 corresponding to a border between the fault inhibiting region ADi and the fault growth region ADg is indicated.

Next, a method of driving the semiconductor device using the body diode current calculation characteristic line map 41 and the fault characteristic line map 42, which prevents degradation by inhibiting stacking faults in the SiC-MOSFET 3a, will be described.

The body diode current calculation characteristic line map 41 and the fault characteristic line map 42 are provided with the product when the power conversion device 10 or the semiconductor module 2a is sold.

When using the power conversion device 10 or the semiconductor modules 2a to 2c after purchase, a user of the power conversion device 10 or the semiconductor modules 2a to 2c first sets the inductance ratio $L_{MOS}/L_{SBD}$. Here, the inductance $L_{MOS}$ of the SiC-MOSFET 3b is expressed as a sum of the external inductance $B_{LMOS}$, the module inductance $M_{LMOS}$, and the chip inductance $C_{LMO}$, as indicated by Formula (2) in the above-described Embodiment 1.

Meanwhile, the inductance $L_{SBD}$ of the Schottky barrier diode 5b is expressed as a sum of the external inductance $B_{LMOS}$, the module inductance $M_{LSBD}$, and the chip inductance $C_{LSBD}$.

Of these inductances, only the external inductance $B_{LMS}$ can be set by the user.

Accordingly, the inductance ratio $L_{MOS}/L_{SBD}$ can be changed by adjusting the external inductance $B_{LMOS}$. Here, the external inductance $B_{LMOS}$ becomes dominant in the inductances $L_{MOS}$ and $L_{SBD}$ as the value of the external inductance $B_{LMOS}$ is increased, and thus the inductance ratio $L_{MOS}/L_{SBD}$ approaches "1" as a result. In this case, based on the above-described Formula (1), the drain current Id(b) and the body diode current $I_{BD}$ become equal, and almost no flyback current flows in the Schottky barrier diode 5b. As such, as the body diode current $I_{BD}$ rises, the width of the fault inhibiting region ADi from the fault characteristic line map 42 indicated in FIG. 15 decreases, and the range of selection for the pulsewidth narrows.

As such, it is desirable that the recommended inductance ratio $L_{MOSD}/L_{SBDD}$ expressed by the straight line L43 and set by the manufacturer be set so that the range of selection for the pulsewidth PW in the fault inhibiting region ADi is relatively broad. On the other hand, if the body diode current $I_{BD}$ is set to a low value, the width of the fault inhibiting region ADi from the fault characteristic line map 42 indicated in FIG. 15 will broaden, but it is then necessary to reduce the amount of flyback current that flows. To do so, it is necessary to limit the amount of current supplied to the three-phase electric motor 17 through the SiC-MOSFET 3a in the arm unit, which forms the basis of the flyback current, and this limits the range of current that can be supplied to the three-phase electric motor.

Accordingly, as indicated in the fault characteristic line map 42 in FIG. 15, the recommended inductance $L_{MOSD}/L_{SBDD}$ is set to the characteristic line 43 in the body diode current calculation characteristic line map 41 indicated in FIG. 14 so that a comparatively high value $I_{BD}10$, which makes it possible to broaden the range of selection of the pulsewidth in the fault inhibiting region ADi, can be obtained for the body diode current $I_{BD}$.

In the case where a user has purchased and uses the power conversion device or the semiconductor modules 2a to 2c, and the user wishes to use an external inductance $B_{LMS}$ that deviates from an inductance that satisfies a recommended external inductance at which the external inductance $B_{LMS}$ achieves the recommended inductance ratio $L_{MOS}/L_{SBD}$, there has conventionally been no way to determine whether or not the fault inhibiting region ADi is adhered to.

According to the present embodiment, first, in the case where the external inductance to be used deviates from the recommended external inductance, an inductance $L_{MOS}1$ of the SiC-MOSFET 3b is first calculated by adding the external inductance to be used to a total value of the module inductance $M_{LMOS}$ and the chip inductance $C_{LMOS}$ of the SiC-MOSFET 3b indicated in the body diode current calculation characteristic line map 41 illustrated in FIG. 14. At the same time, an inductance $L_{SBD}1$ of the Schottky barrier diode 5b is calculated by adding the external inductance to be used to a total value of the module inductance $M_{LSBD}$ and the chip inductance $C_{LMOS}$ of the Schottky barrier diode 5a indicated in the body diode current calculation characteristic line map 41.

An inductance ratio $L_{MOS}1/L_{SBD}1$ of the calculated inductance $L_{MOS}1$ and inductance $L_{SBD}1$ is then calculated.

Next, the calculated inductance ratio $L_{MOS}1/L_{SBD}1$ is taken on the vertical axis of the body diode current calculation characteristic line map 41 indicated in FIG. 14, and one of the characteristic line L41 and L42 of the drain current Id(b) to be used is selected.

Here, assuming the characteristic line L41 has been selected, a body diode current $I_{BD}11$ is calculated by drawing a horizontal line from the inductance ratio $L_{MOS}1/L_{SBD}1$ to the selected characteristic line L41, and drawing a vertical line from a point of intersection with the characteristic line L41 toward the horizontal axis, as indicated by the dotted line in FIG. 14.

Next, by placing the calculated body diode current $I_{BD}11$ on the vertical axis of the fault characteristic line map 42 illustrated in FIG. 15, a range up to a point of intersection P (12.5,72) between the vertical axis and the characteristic line L44, indicated by the dotted line in the drawing, is taken as the range of selection of the pulsewidth PW in the fault inhibiting region ADi.

Accordingly, using a pulsewidth PW in the selected range in FIG. 15 makes it possible to inhibit the growth of stacking faults in the SiC-MOSFET 3b, inhibit a rise in the on-state resistance, and inhibit an increase in conduction loss, even in the case where a flyback current flows in the body diode 4b of the SiC-MOSFET 3b. This makes it possible to prevent degradation of the SiC-MOSFETs 3a and 3b.

In this manner, according to Embodiment 3, by setting the inductance ratio $L_{MOS}/L_{SBD}$, calculating the body diode current $I_{BD}$ from the inductance ratio $L_{MOS}/L_{SBD}$ by referring to the body diode current calculation characteristic line map illustrated in FIG. 14, and referring to the fault inhibiting characteristic line map illustrated in FIG. 15 on the basis of the calculated body diode current $I_{BD}$, the range of the pulsewidth PW for usage within the fault inhibiting region ADi can be confirmed. As such, a user can, based on the inductance ratio, easily confirm driving conditions that can inhibit the SiC-MOSFETs 3a and 3b from degrading.

In Embodiment 3 as well, a hyperbolic fault inhibiting characteristic curve L45, indicated by the dotted line in the drawing, which sets a fault inhibiting region with certainty, may be set in the fault inhibiting characteristic line map 42 illustrated in FIG. 15, in the same manner as in the fault inhibiting characteristic map illustrated in FIG. 5.

Although Embodiment 3 describes a case where the body diode current calculation characteristic line map 41 and the fault characteristic line map 42 are prepared, the invention is not limited thereto. The body diode current calculation characteristic line map 41 and the fault characteristic line map 42 may be stored as maps in a storage unit such as a ROM in advance, and the external inductance may be inputted into a processing unit such as a microcomputer through an input unit such as a keyboard. The inductance $L_{MOS}$ and $L_{SBD}$ may be calculated and the inductance ratio $L_{MOS}/L_{SBC}$ may be calculated; the body diode current $I_{BD}$ may then be calculated by referring to the body diode current calculation map on the basis of the calculated inductance ratio $L_{MOS}/L_{SBD}$, and the range of selection of the pulsewidth PW may be calculated by referring to the fault characteristics map on the basis of the calculated body diode current $I_{BD}$. The range of selection may then be displayed in a monitor or printed using a printer.

Although the foregoing embodiments describe a case where a SiC-MOSFET is applied as the wide bandgap semiconductor element, the invention is not limited thereto, and another wide bandgap semiconductor element such as a GaN-MOSFET or a diamond-MOSFET may be applied instead.

Additionally, although the foregoing embodiments describe a case where a Schottky barrier diode is connected in parallel to the body diode of the wide bandgap semiconductor element, the invention is not limited thereto, and various types of flyback diodes can be applied, such as a Si-flyback diode, an SiC-flyback diode, an SiC-Schottky barrier diode, a GaN-flyback diode, a GaN Schottky barrier diode, a diamond-flyback diode, or a diamond-Schottky barrier diode.

The technical scope of the present invention is not intended to be limited to the exemplary embodiments depicted in the drawings, and includes all embodiments providing effects equivalent to those set forth as objects of the present invention. Furthermore, the technical scope of the present invention is not limited to combinations of features of the invention delimited by the claims, and can be delimited by all desired combinations of specific features among all the features disclosed herein.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a switching arm unit including a first wide bandgap semiconductor element and a second wide bandgap semiconductor element, each having a body diode, connected in series between a positive line and a negative line, the switching arm unit having a node between the first and second wide bandgap semiconductor elements that is configured to be connected to a load;
   a current detecting unit that detects a current in the second wide bandgap semiconductor element that indicates a flyback current flowing in the second wide bandgap semiconductor element, the flyback current being generated as a result of said load been driven by the first wide bandgap semiconductor element;
   a driving unit that drives said first wide bandgap semiconductor element and said second wide bandgap semiconductor element; and
   a memory storing a fault inhibiting characteristic curve defining a border between a fault growth region and a fault inhibiting region for a crystalline semiconductor constituting the second wide bandgap semiconductor element,
   wherein said driving unit determines, by referring to said fault inhibiting characteristic curve, whether the detected current of the second wide bandgap semiconductor element falls within the fault growth region or within the fault inhibiting region, and when a result of said determination indicates that the detected current is within the fault growth region, the driving unit outputs, to the first wide bandgap semiconductor element, a driving signal that reduces a current flowing in the first wide bandgap semiconductor element when driving said load therethrough so that a resultant current detected by the current detecting unit falls within the fault inhibiting region.

2. The semiconductor device according to claim 1,
   wherein said fault inhibiting characteristic curve represents a current flowing in the second wide bandgap semiconductor element as a function of a pulsewidth of a pulse-form current occurring in the flyback current of the body diode of the second wide bandgap semiconductor element at a beginning of the flyback current, and
   wherein said driving unit determines whether the detected current in the second wide bandgap semiconductor element falls within the fault growth region or falls within the fault inhibiting region by referring to said fault inhibiting characteristic curve at the pulsewidth of said pulse-form current generated under a current driving condition.

3. A method of driving a semiconductor device, the semiconductor device including a switching arm unit having a first wide bandgap semiconductor element and a second wide bandgap semiconductor element, each having a body diode, connected in series between a positive line and a negative line, the method comprising:
   a step of detecting a flyback current in said second wide bandgap semiconductor element; and
   a step of determining, by referring to a fault inhibiting characteristic curve expressing a border between a fault growth region and a fault inhibiting region, whether the detected flyback current in the second wide bandgap semiconductor element is within the fault growth region or within the fault inhibiting region.

4. The method of driving the semiconductor device according to claim 3,
   wherein said fault inhibiting characteristic curve is formed as a map that takes a pulsewidth of a pulse-form current occurring in the flyback current at a beginning of the flyback current of the body diode of the second wide bandgap semiconductor element on a horizontal axis and the flyback current value on a vertical axis.

5. A method of driving a semiconductor device, the semiconductor device including:
  a switching arm unit including:
    a first wide bandgap semiconductor element and a second wide bandgap semiconductor element, each having a body diode, connected in series,
    a first diode connected in reverse-parallel to said first wide bandgap semiconductor element, and
    a second diode connected in reverse-parallel to said second wide bandgap semiconductor element; and
  a memory storing:
    a characteristic line map, having a plurality of characteristic lines, each of which expresses, using a flyback current flowing in the body diode of the second wide bandgap semiconductor element as a parameter, a relationship between a ratio of an inductance of the second wide bandgap semiconductor element to an inductance of said diode connected in reverse-parallel to the second wide bandgap semiconductor element and a pulsewidth of a pulse-form current occurring in the flyback current in the body diode of the second wide bandgap semiconductor element at a beginning of the flyback current, said relationship inhibiting occurrence of stacking fault in a crystalline semiconductor constituting the second wide bandgap semiconductor element; and
    a slope characteristic line map that indicates, as a function of a maximum current of the flyback current, a permissible range of slopes from slopes of the characteristic lines in said characteristic line map within which occurrence of the stacking fault in the crystalline semiconductor constituting the second wide bandgap semiconductor element is inhibited,
  the method comprising:
    selecting a slope of a characteristic line from said permissible range of slopes indicated in the slope characteristic line map on the basis of said maximum current of the flyback current;
    determining a desired pulsewidth of the pulse-form current occurring in the flyback current in the body diode of the second wide bandgap semiconductor element in accordance with the selected slope of the characteristic line; and
    driving the first and second wide bandgap semiconductor elements in such a manner as to generate said desired pulsewidth for the pulse-form current occurring in the flyback current in the body diode of the second wide bandgap semiconductor element, thereby inhibiting occurrence of the stacking fault in the crystalline semiconductor constituting the second wide bandgap semiconductor element.

6. A method of driving a semiconductor device, the semiconductor device including a switching arm unit including:
  a first wide bandgap semiconductor element and a second wide bandgap semiconductor element, each having a body diode, connected in series,
  a first diode connected in reverse-parallel to said first wide bandgap semiconductor element, and
  a second diode connected in reverse-parallel to said second wide bandgap semiconductor element,
  the method comprising:
    a step of calculating a flyback current in a body diode of the second wide bandgap semiconductor element from a ratio of an inductance of the second wide bandgap semiconductor element to an inductance of said diode connected in reverse-parallel to the second wide bandgap semiconductor element and a detected current flowing in the second wide bandgap semiconductor element;
    a step of determining, by referring to a fault inhibiting characteristic curve defining a border between a fault growth region and a fault inhibiting region on a basis of the calculated flyback current, a desired pulsewidth of a pulse-form current occurring in the flyback current in the body diode of the second wide bandgap semiconductor element at a beginning of the flyback current that falls within the fault inhibiting region;
    driving the first and second wide bandgap semiconductor elements in such a manner as to generate said determined desired pulsewidth for the pulse-form current occurring in the flyback current in the body diode of the second wide bandgap semiconductor element, thereby inhibiting occurrence of stacking fault in a crystalline semiconductor constituting the second wide bandgap semiconductor element.

7. The method of driving the semiconductor device according to claim 6,
  wherein the inductance of said second wide bandgap semiconductor element is calculated as a sum of a chip inductance of a chip including the second wide bandgap semiconductor element, an inductance of a module including the second wide bandgap semiconductor element, and an external inductance, and
  wherein the inductance of said diode is calculated as a sum of a chip inductance of a chip including the diode, an inductance of a module including the diode, and an external inductance.

8. The method of driving the semiconductor device according to claim 7, further including adjusting said ratio by adjusting the external inductance of said wide bandgap semiconductor element and adjusting the external inductance of the diode.

* * * * *

UNITED STATES PATENT AND TRADEMARK OFFICE
CERTIFICATE OF CORRECTION

PATENT NO. : 9,595,958 B1  
APPLICATION NO. : 15/232526  
DATED : March 14, 2017  
INVENTOR(S) : Hayato Nakano and Ryohei Takayanagi Page 1 of 1

It is certified that error appears in the above-identified patent and that said Letters Patent is hereby corrected as shown below:

Column 7, Lines 63 to 64, Formula (1) "$Id(b) = (L_{MOS} / L_{SBD}) \times I_{BD} \times I_{BD}$" should be changed to -- $Id(b) = (L_{MOS} / L_{SBD}) \times I_{BD}$ --.

Column 9, Line 16, Column 16, Lines 3 and 7 and Column 17, Lines 27, 32, 37, 38 and 40, for the text "$B_{LMOS}$" each occurrence, should be changed to -- $B_{LMS}$ --.

Signed and Sealed this  
Twenty-third Day of May, 2017

Michelle K. Lee  
*Director of the United States Patent and Trademark Office*